United States Patent
Zhai

(10) Patent No.: US 10,650,733 B2
(45) Date of Patent: May 12, 2020

(54) LIGHT-EMITTING CONTROL SIGNAL GENERATION CIRCUIT, DRIVING METHOD, AND DISPLAY DEVICE THEREOF

(71) Applicant: Shanghai Tianma Micro-Electronics Co., Ltd., Shanghai (CN)

(72) Inventor: Yingteng Zhai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 143 days.

(21) Appl. No.: 15/864,644

(22) Filed: Jan. 8, 2018

(65) Prior Publication Data

US 2018/0130407 A1 May 10, 2018

(30) Foreign Application Priority Data

Sep. 29, 2017 (CN) .......................... 2017 1 0912348

(51) Int. Cl.
*G09G 3/3208* (2016.01)
*H03K 3/017* (2006.01)

(52) U.S. Cl.
CPC .......... *G09G 3/3208* (2013.01); *H03K 3/017* (2013.01); *G09G 2310/0286* (2013.01); *G09G 2310/08* (2013.01); *G09G 2320/064* (2013.01)

(58) Field of Classification Search
CPC ......... G09G 3/3208; G09G 2300/0871; G09G 2310/0286; G09G 2320/064; H03K 3/017
See application file for complete search history.

(56) References Cited

U.S. PATENT DOCUMENTS

| 2012/0188290 A1* | 7/2012 | Park ..................... G09G 3/3266 345/690 |
| 2013/0170606 A1* | 7/2013 | Matsui .................. G11C 19/28 377/64 |
| 2016/0372070 A1 | 12/2016 | Hu et al. |
| 2017/0018228 A1* | 1/2017 | Wang ................... G09G 3/3266 |
| 2017/0116920 A1* | 4/2017 | Kwon .................. G09G 3/3266 |

(Continued)

FOREIGN PATENT DOCUMENTS

| CN | 102760407 A | 10/2012 |
| CN | 103700355 A | 4/2014 |

(Continued)

*Primary Examiner* — Priyank J Shah
(74) *Attorney, Agent, or Firm* — Anova Law Group PLLC

(57) ABSTRACT

A light-emitting control signal generation circuit, a driving method thereof, and a display device are provided. The light-emitting control signal generation circuit includes a first control unit, a second control unit, and an output unit. The first control unit controls a potential-level on a first node under control of an effective pulse signal, a first clock signal, a second clock signal, and a first voltage signal. The second control unit controls a potential-level on a second node under control of the effective pulse signal, the first clock signal, the second clock signal, the first voltage signal, a second voltage signal, and the potential-level on the first node. The output unit transmits the first voltage signal to an signal output terminal under control of the potential-level on the first node, and transmits the second voltage signal to the signal output terminal under control of the potential-level on the second node, respectively.

18 Claims, 16 Drawing Sheets

(56) References Cited

U.S. PATENT DOCUMENTS

| | | | |
|---|---|---|---|
| 2017/0200418 A1* | 7/2017 | Zhang | G11C 19/28 |
| 2017/0278450 A1* | 9/2017 | Ma | G09G 3/2092 |
| 2017/0287395 A1* | 10/2017 | Jang | G09G 3/3233 |
| 2017/0301407 A1* | 10/2017 | Ma | G09G 3/20 |
| 2017/0330633 A1* | 11/2017 | Sun | G11C 19/28 |
| 2018/0096732 A1* | 4/2018 | Cheng | G11C 19/28 |
| 2018/0130541 A1* | 5/2018 | Li | G09G 5/003 |
| 2018/0211716 A1* | 7/2018 | Ma | G09G 3/20 |
| 2018/0374410 A1* | 12/2018 | Zhu | G09G 3/20 |
| 2019/0073933 A1* | 3/2019 | Xuan | G09G 3/20 |
| 2019/0340975 A1* | 11/2019 | Zhai | H03K 3/017 |

FOREIGN PATENT DOCUMENTS

| | | |
|---|---|---|
| CN | 103886836 A | 6/2014 |
| CN | 105609042 A | 5/2016 |
| CN | 105609054 A | 5/2016 |
| CN | 105702295 A | 6/2016 |
| CN | 105810150 A | 7/2016 |
| CN | 106601177 A | 4/2017 |
| CN | 106887209 A | 6/2017 |

* cited by examiner

LIGHT-EMITTING CONTROL SIGNAL GENERATION CIRCUIT, DRIVING METHOD, AND DISPLAY DEVICE THEREOF

CROSS-REFERENCES TO RELATED APPLICATIONS

This application claims the priority of Chinese patent application No. 201710912348.1, filed on Sep. 29, 2017, the entirety of which is incorporated herein by reference.

FIELD OF THE DISCLOSURE

The present disclosure generally relates to the field of display technology and, more particularly, relates to a light-emitting control signal generation circuit, a driving method, and a display device thereof.

BACKGROUND

Among conventional flat panel displays, an organic light-emitting display (OLED), as an active light-emitting display, has gradually become the mainstream of the display field due to advantages of low power consumption, high color saturation, and wide viewing angle, etc. To realize display functions of the OLED display, a light-emitting control signal may generally need to be inputted into a display area of the OLED display to facilitate display of images. However, to meet the display requirement for the OLED display to adapt to different brightness, the pulse width of the light-emitting control signal may need to be adjusted. Thus, how to make the light-emitting control signal generation circuit to output a pulse signal with an adjustable pulse width, so as to satisfy different brightness display requirements, has become an urgent technical problem to be solved. The disclosed device structures and methods are directed to solve one or more problems set forth above and other problems.

BRIEF SUMMARY OF THE DISCLOSURE

One aspect of the present disclosure includes a light-emitting control signal generation circuit. The light-emitting control signal generation circuit includes a first control unit for controlling a potential-level on a first node under control of an effective pulse signal inputted from a signal input terminal, a first clock signal inputted from a first clock signal terminal, a second clock signal inputted from a second clock signal terminal, and a first voltage signal inputted from a first voltage signal terminal. The light-emitting control signal generation circuit also includes a second control unit for controlling a potential-level on a second node under control of the effective pulse signal inputted from the signal input terminal, the first clock signal inputted from the first clock signal terminal, the second clock signal inputted from the second clock signal terminal, the first voltage signal inputted from the first voltage signal terminal, a second voltage signal inputted from a second voltage signal terminal, and the potential-level on the first node. Further, the light-emitting control signal generation circuit includes an output unit for transmitting the first voltage signal inputted from the first voltage signal terminal to an signal output terminal under control of the potential-level on the first node, and transmitting the second voltage signal inputted from the second voltage signal terminal to the signal output terminal under control of the potential-level on the second node, respectively.

Another aspect of the present disclosure includes a method for driving a light-emitting control signal generation circuit having a plurality of driving phases. The method includes providing a second potential-level signal to a signal input terminal and a first clock signal terminal, respectively, and providing a first potential-level signal to a second clock signal terminal in a first phase. A signal output terminal outputs the second potential-level signal. The method also includes providing the first potential-level signal to the signal input terminal and the first clock signal terminal, respectively, and providing the second potential-level signal to the second clock signal terminal in a second phase. The signal output terminal outputs the second potential-level signal. In addition, the method includes providing the first potential-level signal to the signal input terminal and the second clock signal terminal, respectively, and providing the second potential-level signal to the first clock signal terminal in a third phase. The signal output terminal outputs the first potential-level signal. Moreover, the method includes providing the second potential-level signal to the signal input terminal and the second clock signal terminal, respectively, and providing the first potential-level signal to the first clock signal terminal in a fourth phase. The signal output terminal outputs the first potential-level signal. Further, the method includes providing the second potential-level signal to the signal input terminal and the first clock signal terminal, respectively, and providing the first potential-level signal to the second clock signal terminal in a fifth phase. The signal output terminal outputs the second potential-level signal.

Another aspect of the present disclosure includes an electroluminescent display panel. The electroluminescent display panel includes a plurality of cascaded light-emitting control signal generation circuits. The light-emitting control signal generation circuit includes a first control unit for controlling a potential-level on a first node under control of an effective pulse signal inputted from a signal input terminal, a first clock signal inputted from a first clock signal terminal, a second clock signal inputted from a second clock signal terminal, and a first voltage signal inputted from a first voltage signal terminal. The light-emitting control signal generation circuit also includes a second control unit for controlling a potential-level on a second node under control of the effective pulse signal inputted from the signal input terminal, the first clock signal inputted from the first clock signal terminal, the second clock signal inputted from the second clock signal terminal, the first voltage signal inputted from the first voltage signal terminal, a second voltage signal inputted from a second voltage signal terminal, and the potential-level on the first node. Further, the light-emitting control signal generation circuit includes an output unit for transmitting the first voltage signal inputted from the first voltage signal terminal to an signal output terminal under control of the potential-level on the first node, and transmitting the second voltage signal inputted from the second voltage signal terminal to the signal output terminal under control of the potential-level on the second node, respectively.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

A pulse width of a light-emitting control signal determines a light-emitting duration of corresponding each pixel unit, and the light-emitting duration determines light-emitting brightness of an OLED display. For example, as the pulse width of the light-emitting control signal increases, the light-emitting duration of the corresponding pixel unit increases and the display brightness thereof increases. As the pulse width of the light-emitting control signal decreases, the light-emitting duration of the corresponding pixel unit decreases and the display brightness thereof decreases. Therefore, the display brightness of the OLED display may be adjusted by changing the pulse width of the light-emitting control signal. During the use of the OLED display, due to the influence of surrounding environments, the brightness of the display needs to be adjusted according to the surrounding environments to clearly display the image. Therefore, the brightness adjustment of the OLED display may be achieved by adjusting the pulse width of the light-emitting control signal.

Figure 1:
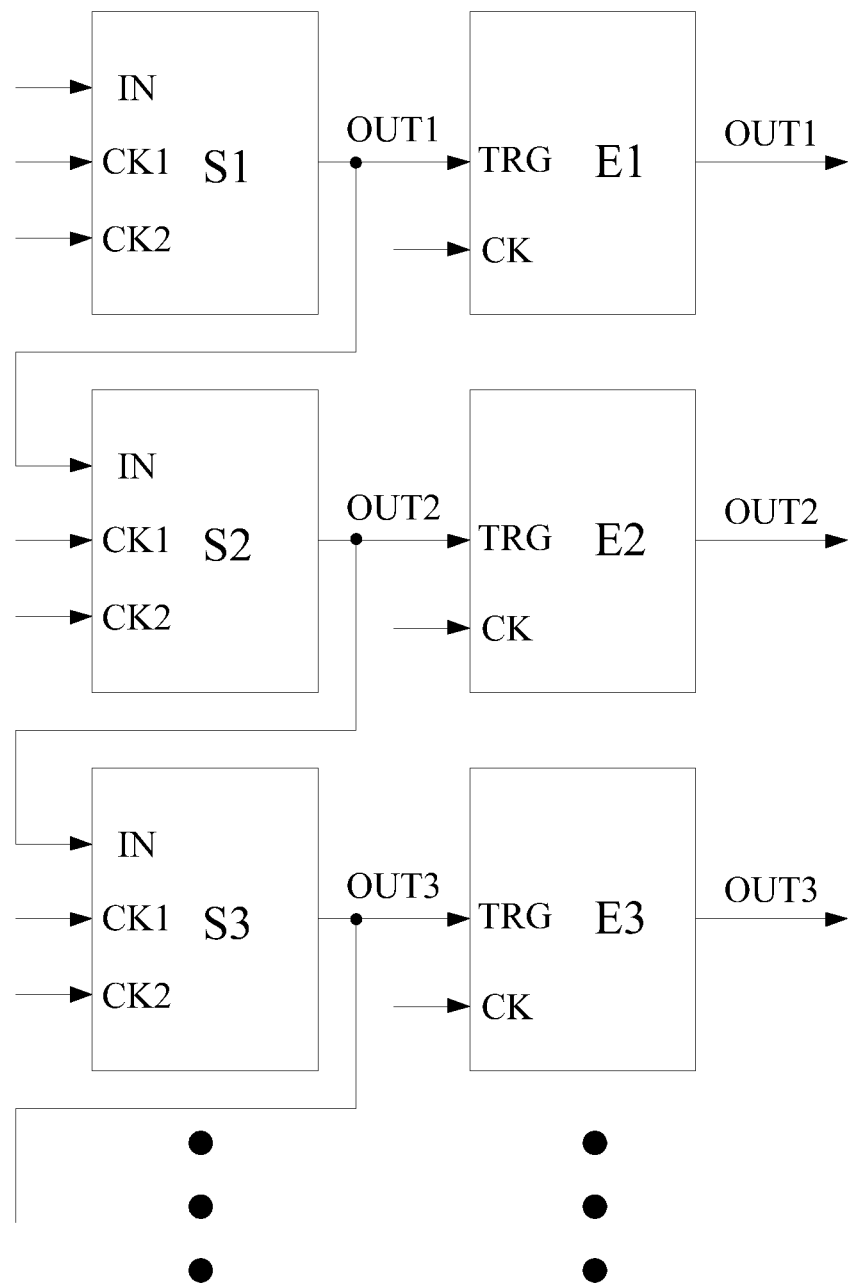
FIG. 1 illustrates a schematic diagram of a connection relationship between a light-emitting control signal generation circuit and a scan signal generation circuit.

However, the conventional light-emitting control signal generation circuit often generates a pulse signal having a fixed width (i.e., the pulse width is fixed). Thus, it is difficult for the OLED display to adjust the display brightness by changing the pulse width, resulting in lack of the operational flexibility, and the system power consumption cannot be effectively reduced. Referring to FIG. 1, when the pulse width of the light-emitting control signal needs to be adjusted, a pulse width of a scan signal outputted from a scan signal generation circuit needs to be adjusted. However, both the pulse width and potential-level of the scan signal are unstable after adjusting the pulse width of the scan signal, such that the pulse width and potential-level of the light-emitting control signal are unstable, resulting in a decrease in the display quality of the display screen and the reduction in the viewing effect.

Specifically, referring to FIG. 1, the scan signal generation circuit (i.e., S1) provides the scan signal to a pixel control circuit in a pixel area. The light-emitting control signal generation circuit (i.e., E1) provides the light-emitting control signal to a pixel control circuit in the pixel area. A light-emitting unit is controlled to emit light by using the scan signal and the light-emitting control signal. A signal output terminal OUT of the scan signal generation circuit provides a trigger signal TRG to a signal input terminal of the light-emitting control signal generation circuit, and the pulse width of the scan signal affects a pulse width of the trigger signal TRG.

Figure 2A:
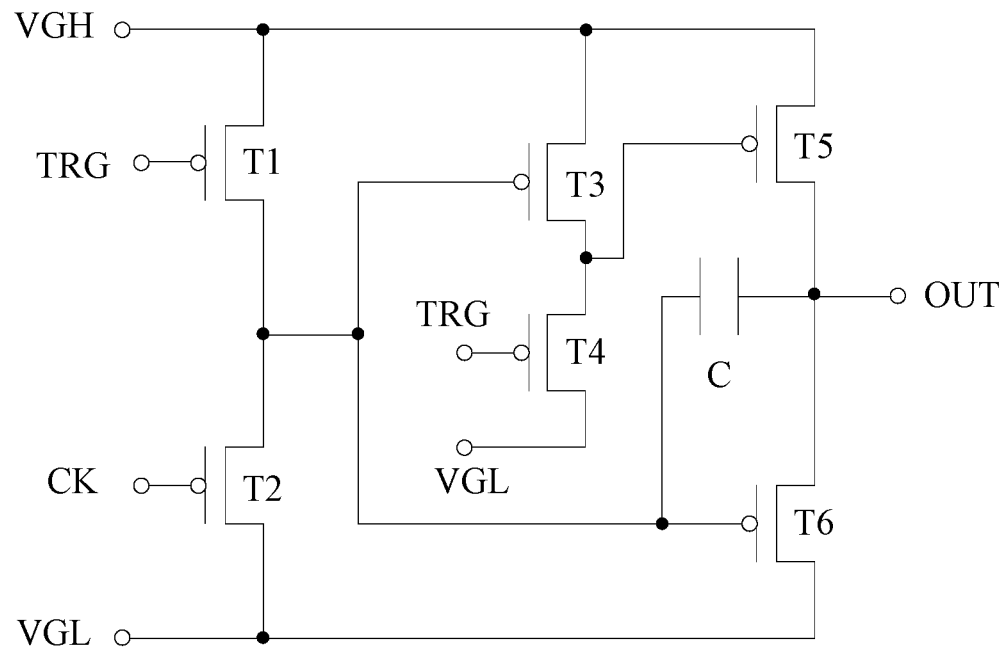
FIG. 2A illustrates a schematic diagram of a light-emitting control signal generation circuit.
Figure 2B:
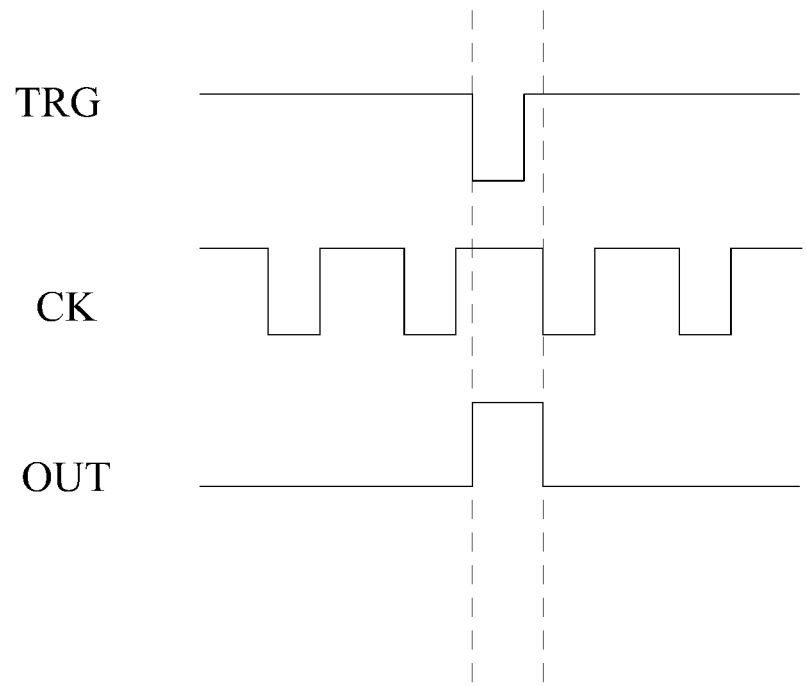
FIG. 2B illustrates an input and output timing sequence diagram.

FIG. 2A illustrates a light-emitting control signal generation circuit. Referring to FIG. 2A, the light-emitting control signal generation circuit includes six P-type switch transistors (i.e., T1-T6) and one capacitor C. FIG. 2B illustrates a corresponding input and output timing sequence diagram. Referring to FIG. 2B, when the trigger signal TRG inputted to the signal input terminal changes from a high-potential-level signal to a low-potential-level signal, the signal output terminal OUT starts to output a high-potential-level signal. After that, when a clock signal inputted to a clock signal terminal CK changes from a high-potential-level signal to a low-potential-level signal for the first time, the signal output terminal OUT starts to output a low-potential-level signal. Thus, the pulse width of the light-emitting control signal is affected by the pulse width of the trigger signal TRG provided by the scan signal generation circuit, such that the pulse width of the scan signal affects the pulse width of the light-emitting control signal. Since both the pulse width and potential-level of the scan signal are unstable after adjusting the pulse width of the scan signal, the pulse width and potential-level of the light-emitting control signal are unstable, such that the screen display effect may be affected.

The present disclosure provides an improved light-emitting control signal generation circuit. The light-emitting control signal generation circuit may output a light-emitting control signal with an adjustable pulse width to meet different brightness display requirements. Therefore, the screen display flexibility may increase while improving the screen display quality, and the system power consumption may be reduced.

Figure 3:
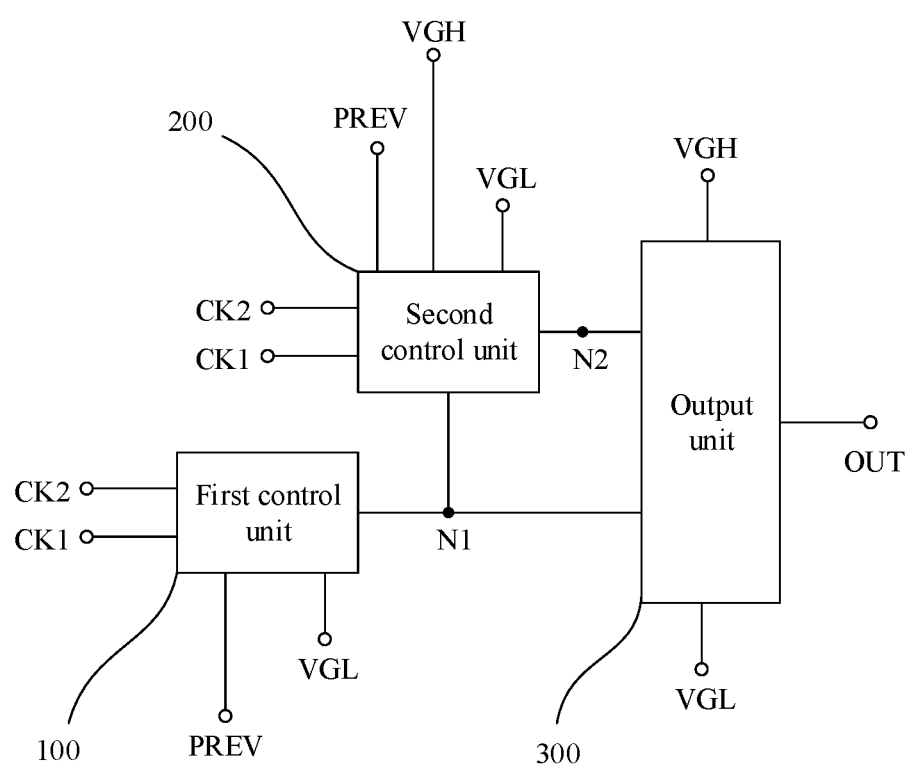
FIG. 3 illustrates a schematic diagram of a light-emitting control signal generation circuit consistent with various disclosed embodiments of the present disclosure.

FIG. 3 illustrates a schematic diagram of a light-emitting control signal generation circuit consistent with various disclosed embodiments. Referring to FIG. 3, the light-emitting control signal generation circuit may include a first control unit 100, a second control unit 200, and an output unit 300.

The first control unit 100 may control a potential-level on a first node N1 under the control of an effective pulse signal inputted from a signal input terminal PREV, a first clock signal inputted from a first clock signal terminal CK1, a second clock signal inputted from a second clock signal terminal CK2, and a first voltage signal inputted from a first voltage signal terminal VGL.

The second control unit 200 may control a potential-level on a second node N2 under the control of the effective pulse signal inputted from the signal input terminal PREV, the first clock signal inputted from the first clock signal terminal CK1, the second clock signal inputted from the second clock signal terminal CK2, the first voltage signal inputted from the first voltage signal terminal VGL, a second voltage signal inputted from a second voltage signal terminal VGH, and the potential-level on the first node N1.

The output unit 300 may transmit one of the first voltage signal inputted from the first voltage signal terminal VGL and the second voltage signal inputted from the second voltage signal terminal VGH to an signal output terminal OUT under the control of the potential-level on the first node N1 and the potential-level on the second node N2, respectively.

In the light-emitting control signal generation circuit consistent with disclosed embodiments, the signal output terminal OUT may output a signal having a same pulse width as the effective pulse signal inputted from the signal input terminal PREV through the cooperation of the aforementioned three units and a simple circuit structure. The pulse width of the outputted signal may be adjusted by adjusting the pulse width of the inputted effective pulse signal to meet the different brightness display requirements.

In one embodiment, in the light-emitting control signal generation circuit consistent with disclosed embodiments, the effective pulse signal inputted from the signal input terminal PREV may be a high-potential-level signal, and both a rising edge and a falling edge of the effective pulse signal outputted from the signal output terminal OUT may be aligned with a falling edge of the first clock signal. The pulse width of the effective pulse signal outputted from the signal output terminal OUT may be controlled through the pulse width of the effective pulse signal inputted from the signal input terminal PREV, thus the adjustment of the pulse width of the outputted signal may be achieved.

In one embodiment, to ensure that the pulse width of the outputted effective pulse signal is the same as the pulse width of the inputted effective pulse signal, in the disclosed light-emitting control signal generation circuit, the pulse width of the effective pulse signal inputted from the signal input terminal PREV may be an integral multiple of the periodic pulse width of the clock signal. In other words, the pulse width of the inputted effective pulse signal may be one, two, three, or other multiples of the periodic pulse width of the clock signal, and may be set correspondingly according to actual needs, to ensure that the pulse width of the outputted effective pulse signal is the same as the pulse width of the inputted effective pulse signal.

In the disclosed light-emitting control signal generation circuit, the effective pulse signal inputted from the signal input terminal PREV may be prolonged for M clock periods, and the effective pulse signal outputted from the signal output terminal OUT may be correspondingly prolonged for M clock periods, where M is a positive integer. Therefore, the duration of the effective pulse signal outputted from the signal output terminal OUT may be controlled by changing the duration of the effective pulse signal inputted from the signal input terminal PREV. In other words, the pulse width of the outputted effective pulse signal may be controlled by changing the pulse width of the inputted effective pulse signal. Therefore, the system flexibility may increase without changing the circuit and process.

To better understand the disclosed light-emitting control signal generation circuit to achieve the adjustment of the pulse width of the outputted effective pulse signal, the following two light-emitting control signal generation circuits will be used as examples to describe the structure and operating processes thereof in detail.

Figure 4:
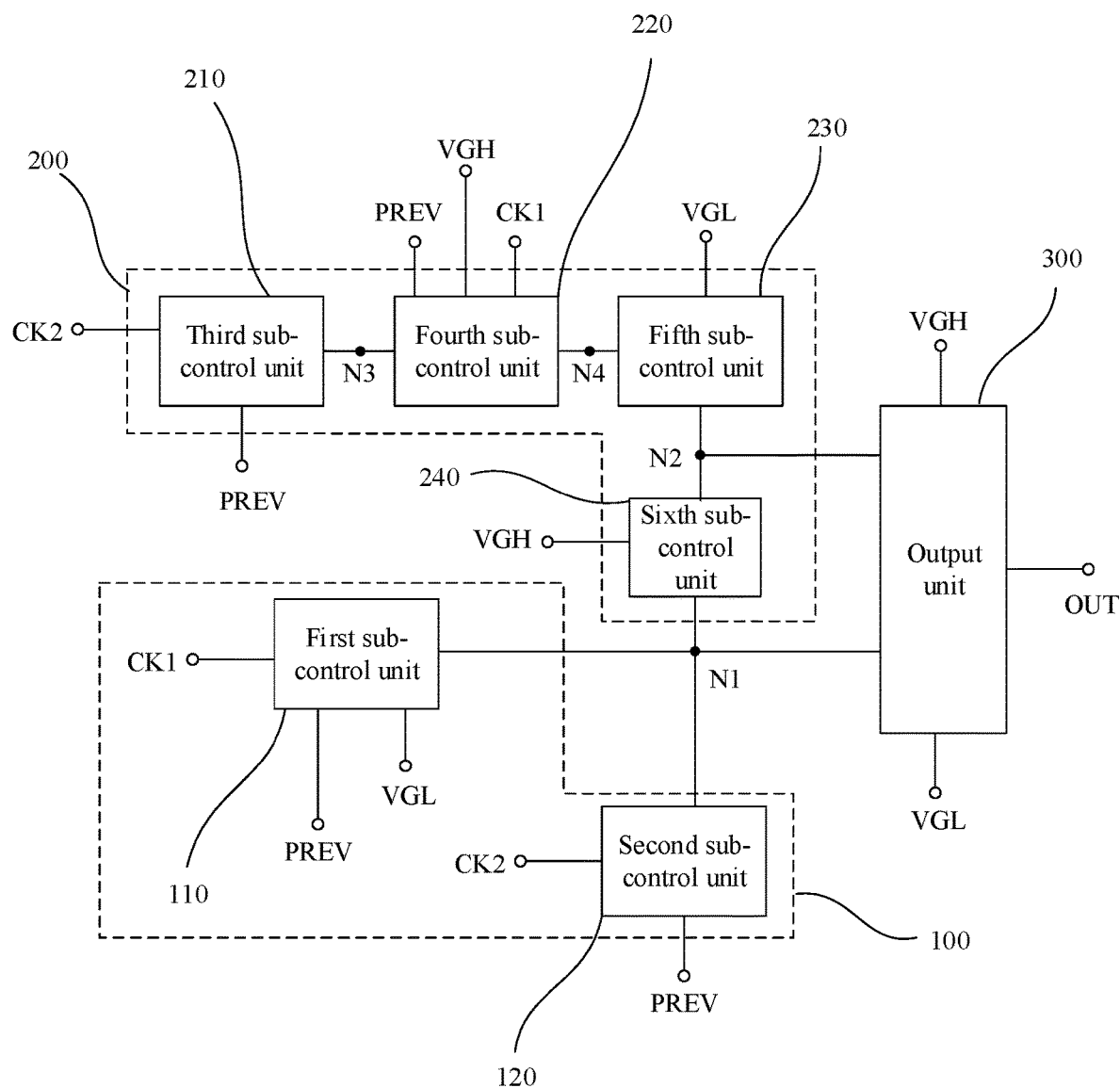
FIG. 4 illustrates a schematic diagram of another light-emitting control signal generation circuit consistent with various disclosed embodiments of the present disclosure.

FIG. 4 illustrates a schematic diagram of a light-emitting control signal generation circuit consistent with various disclosed embodiments. Referring to FIG. 4, to realize the functions of the first control unit 100, the first control unit 100 may include a first sub-control unit 110 and a second sub-control unit 120.

A first terminal of the first sub-control unit 110 may be electrically connected to the signal input terminal PREV. A second terminal thereof may be electrically connected to the first clock signal terminal CK1. A third terminal thereof may be electrically connected to the first node N1. A fourth terminal thereof may be electrically connected to the first voltage signal terminal VGL. The first sub-control unit 110 may transmit the effective pulse signal inputted from the signal input terminal PREV to the first node N1 under the control of the first clock signal inputted from the first clock signal terminal CK1, and may maintain the potential-level on the first node N1 under the control of the first voltage signal inputted from the first voltage signal terminal VGL.

A first terminal of the second sub-control unit 120 may be electrically connected to the signal input terminal PREV. A second terminal thereof may be electrically connected to a second clock signal terminal CK2. A third terminal thereof may be electrically connected to the first node N1. The second sub-control unit 120 may control the potential-level on the first node N1 under the control of the effective pulse signal inputted from the signal input terminal PREV and the second clock signal inputted from the second clock signal terminal CK2.

Figure 5:
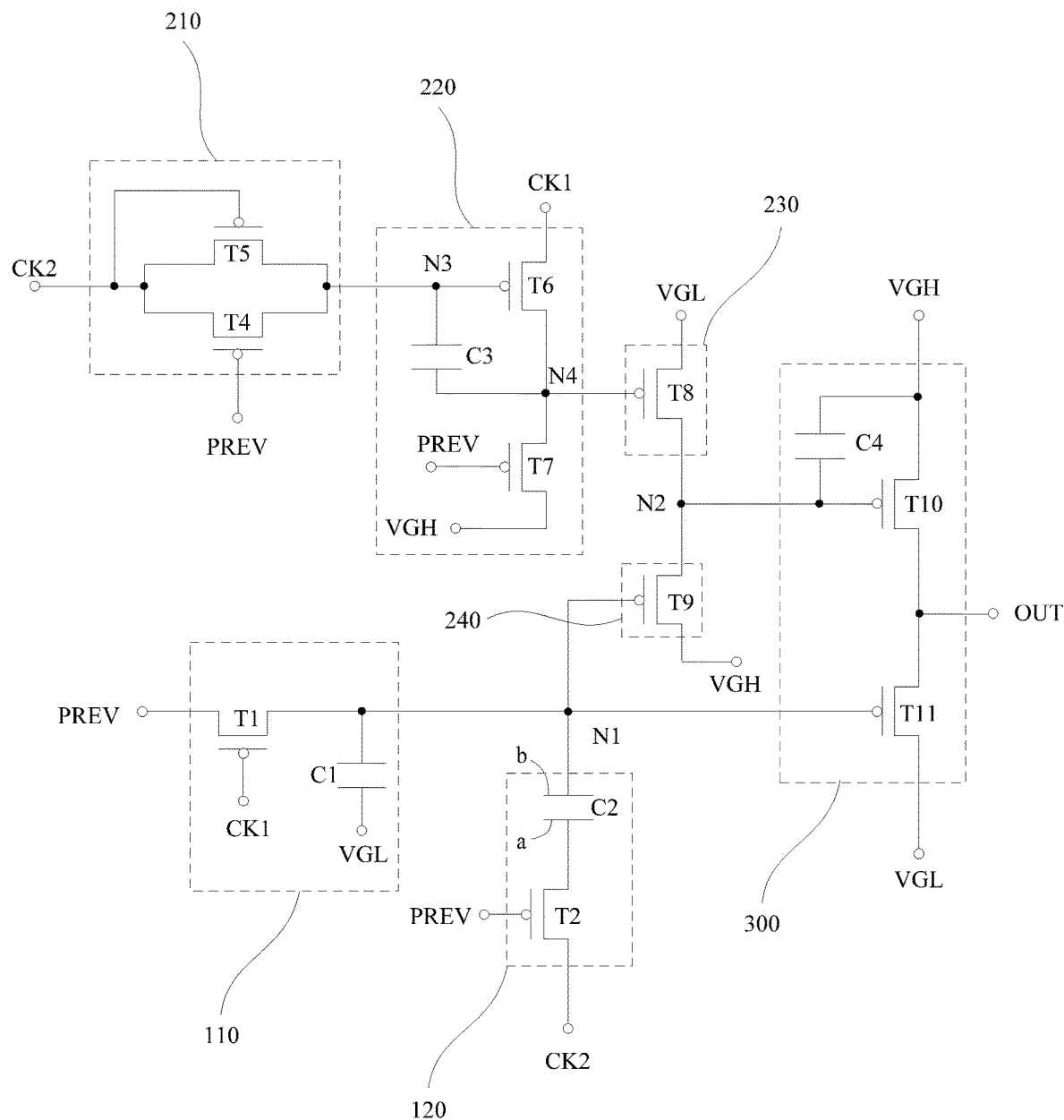
FIG. 5 illustrates a schematic diagram of another light-emitting control signal generation circuit consistent with various disclosed embodiments of the present disclosure.
Figure 6:
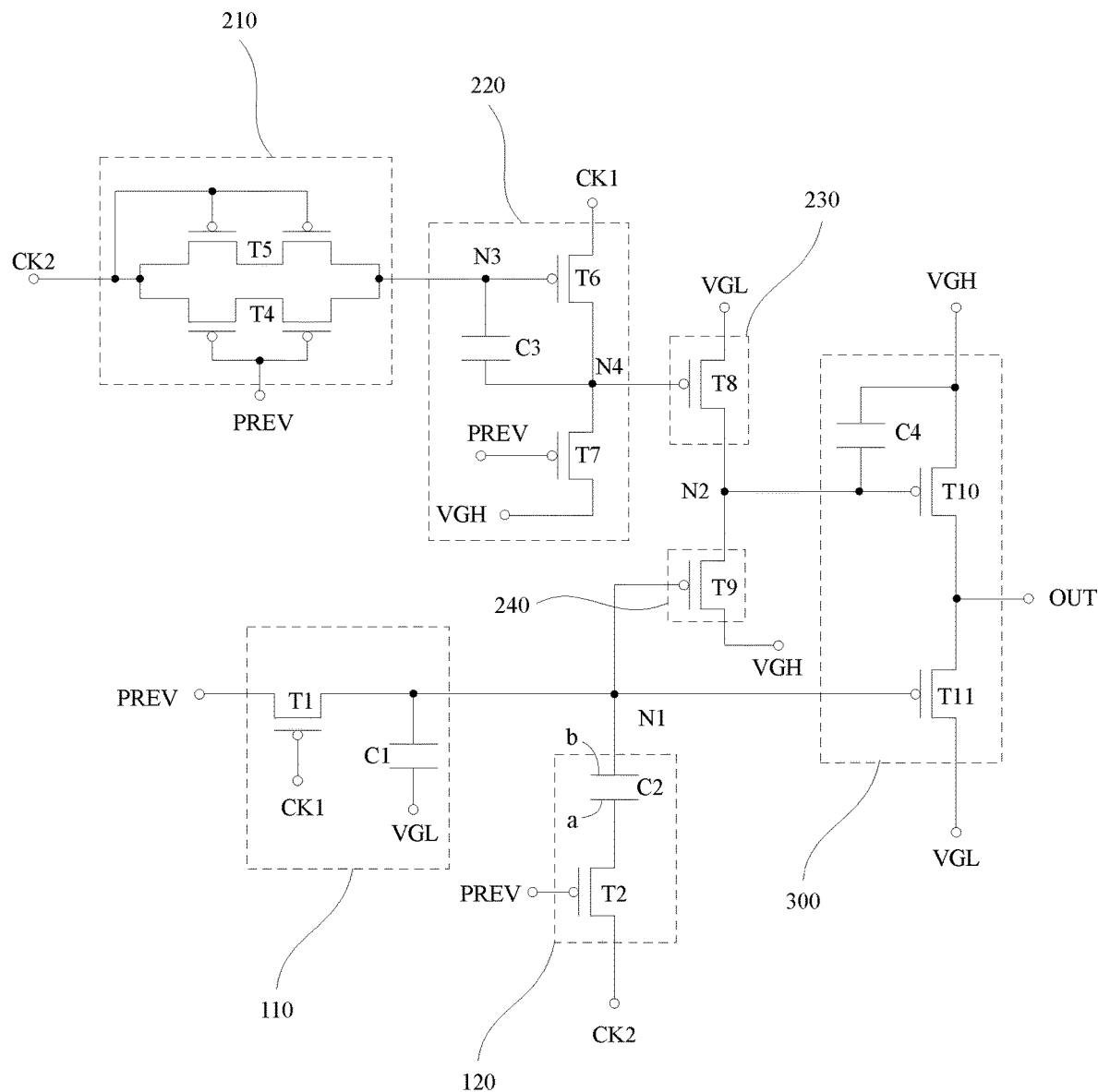
FIG. 6 illustrates a schematic diagram of another light-emitting control signal generation circuit consistent with various disclosed embodiments of the present disclosure.

In one embodiment, to realize the functions of the first sub-control unit 110, in the disclosed light-emitting control signal generation circuit, referring to FIGS. 5-6, the first sub-control unit 110 may include a first switch transistor T1 and a first capacitor C1.

A gate of the first switch transistor T1 may be electrically connected to the first clock signal terminal CK1. A source thereof may be electrically connected to the signal input terminal PREV, and a drain thereof may be electrically connected to the first node N1. The first capacitor C1 may be connected between the first node N1 and the first voltage signal terminal VGL.

In one embodiment, the first switch transistor T1 may transmit the effective pulse signal inputted from the signal input terminal PREV to the first node N1 under the control of the first clock signal inputted from the first clock signal terminal CK1. The first capacitor C1 may maintain the potential-level on the first node N1 under the control of the first voltage signal inputted from the first voltage signal terminal VGL.

In one embodiment, the first switch transistor T1 may be a P-type transistor, and the first clock signal inputted from the first clock signal terminal CK1 may be a low-potential-level signal. In another embodiment, the first switch transistor T1 may be an N-type transistor, and the first clock signal inputted from the first clock signal terminal CK1 may be a high-potential-level signal.

The specific structure of the first sub-control unit 110 in the above embodiment is used as an example. In certain embodiments, the first sub-control unit 110 is not limited to the structure provided in the above embodiment and may have other structures.

In one embodiment, to realize the functions of the second sub-control unit 120, in the disclosed light-emitting control signal generation circuit, referring to FIGS. 5-6, the second sub-control unit 120 may include a second switch transistor T2 and a second capacitor C2.

A gate of the second switch transistor T2 may be electrically connected to the signal input terminal PREV. A source thereof may be electrically connected to the second clock signal terminal CK2, and a drain thereof may be electrically connected to a first terminal of the second capacitor C2. A second terminal of the second capacitor C2 may be electrically connected to the first node N1.

In one embodiment, the second switch transistor T2 may transmit the second clock signal inputted from the second clock signal terminal CK2 to the first terminal of the second capacitor C2 under the control of the effective pulse signal inputted from the signal input terminal PREV. The second capacitor C2 may maintain a voltage difference between 'a' terminal and 'b' terminal (the first node N1) thereof.

In one embodiment, the second switch transistor T2 may be a P-type transistor, and the effective pulse signal inputted from the signal input terminal PREV may be a low-potential-level signal. In another embodiment, the second switch transistor T2 may be an N-type transistor, and the effective pulse signal inputted from the signal input terminal PREV may be a high-potential-level signal.

Since the output unit 300 transmits the first voltage signal inputted from the first voltage signal terminal VGL to the signal output terminal OUT under the control of the potential-level on the first node N1, the second sub-control unit 120 may need to cooperate with the first sub-control unit 110 to control the potential-level on the first node N1, such that the signal output terminal OUT may output a low-potential-level- signal. When the potential-level on the first node N1 is at a low level, the second sub-control unit 120 may effectively maintain the potential-level on the first node N1 to prevent the signal output terminal OUT of the output unit 300 from outputting unstable low-potential-level signal due to the fluctuation of the potential-level on the first node N1.

The specific structure of the second sub-control unit 120 in the above embodiment is used as an example. In certain embodiments, the second sub-control unit 120 is not limited to the structure provided in the above embodiment and may have other structures.

To realize the functions of the second control unit 200, in the disclosed light-emitting control signal generation circuit, referring to FIG. 4, the second control unit 200 may include a third sub-control unit 210, a fourth sub-control unit 220, a fifth sub-control unit 230, and a sixth sub-control unit 240.

A first terminal of the third sub-control unit 210 may be electrically connected to the signal input terminal PREV. A second terminal thereof may be electrically connected to the second clock signal terminal CK2. A third terminal thereof may be electrically connected to a third node N3. In one embodiment, the third sub-control unit 210 may transmit the second clock signal inputted from the second clock signal terminal CK2 to the third node N3 under the control of the effective pulse signal inputted from the signal input terminal PREV. In another embodiment, the third sub-control unit 210 may transmit the second clock signal inputted from the second clock signal terminal CK2 to the third node N3 under the control of the second clock signal inputted from the second clock signal terminal CK2.

A first terminal of the fourth sub-control unit 220 may be electrically connected to the signal input terminal PREV. A second terminal thereof may be electrically connected to the first clock signal terminal CK1. A third terminal thereof may be electrically connected to the second voltage signal terminal VGH. A fourth terminal thereof may be electrically connected to the third node N3. A fifth terminal thereof may be electrically connected to a fourth node N4. In one embodiment, the fourth sub-control unit 220 may transmit the second voltage signal inputted from the second voltage signal terminal VGH to the fourth node N4 under the control of the effective pulse signal inputted from the signal input terminal PREV. In another embodiment, the fourth sub-control unit 220 may transmit the first clock signal inputted from the first clock signal terminal CK1 to the fourth node N4 under the control of the potential-level on the third node N3.

A first terminal of the fifth sub-control unit 230 may be electrically connected to the fourth node N4. A second terminal thereof may be electrically connected to the first voltage signal terminal VGL. A third terminal thereof may be electrically connected to the second node N2. The fifth sub-control unit 230 may transmit the first voltage signal inputted from the first voltage signal terminal VGL to the second node N2 under the control of the potential-level on the fourth node N4.

A first terminal of the sixth sub-control unit 240 may be electrically connected to the first node N1. A second terminal thereof may be electrically connected to the second node N2. A third terminal thereof may be electrically connected to the second voltage signal terminal VGH. The sixth sub-control unit 240 may transmit the second voltage signal inputted from the second voltage signal terminal VGH to the second node N2 under the control of the potential-level on the first node N1.

In one embodiment, to realize the functions of the third sub-control unit 210, in the disclosed light-emitting control signal generation circuit, referring to FIG. 5, the third sub-control unit 210 may include a fourth switch transistor T4 and a fifth switch transistor T5.

A gate of the fourth switch transistor T4 may be electrically connected to the signal input terminal PREV. A source thereof may be electrically connected to the second clock signal terminal CK2, and a drain thereof may be electrically connected to the third node N3.

A gate and a source of the fifth switch transistor T5 may be electrically connected to the second clock signal terminal CK2. A drain thereof may be electrically connected to the third node N3.

In one embodiment, the fourth switch transistor T4 may transmit the second clock signal inputted from the second clock signal terminal CK2 to the third node N3 under the control of the effective pulse signal inputted from the signal input terminal PREV. The fifth switch transistor T5 may transmit the second clock signal inputted from the second clock signal terminal CK2 to the third node N3 under the control of the second clock signal inputted from the second clock signal terminal CK2.

In one embodiment, both the fourth switch transistor T4 and the fifth switch transistor T5 may be P-type transistors, the effective pulse signal inputted from the signal input terminal PREV may be a low-potential-level signal, and the second clock signal inputted from the second clock signal terminal CK2 may be a low-potential-level signal. In another embodiment, both the fourth switch transistor T4 and the fifth switch transistor T5 may be N-type transistors, the effective pulse signal inputted from the signal input terminal PREV may be a high-potential-level signal, and the second clock signal inputted from the second clock signal terminal CK2 may be a high-potential-level signal.

Further, to reduce leakage current of the fourth switch transistor T4 and the fifth switch transistor T5, and to increase the stability of the light-emitting control signal generation circuit, in the disclosed light-emitting control signal generation circuit, referring to FIG. 6, the fourth switch transistor T4 may be a first double gate transistor, and/or the fifth switch transistor T5 may be a second double gate transistor.

Both a first gate and a second gate of the first double gate transistor may be electrically connected to the signal input terminal PREV. A source thereof may be electrically connected to the second clock signal terminal CK2. A drain thereof may be electrically connected to the third node N3.

Both a first gate and a second gate of the second double gate transistor may be electrically connected to the second clock signal terminal CK2. A source thereof may be electrically connected to the second clock signal terminal CK2. A drain thereof may be electrically connected to the third node N3.

In one embodiment, one of the fourth switch transistor T4 and the fifth switch transistor T5 may be a double gate transistor. In another embodiment, both the fourth switch transistor T4 and the fifth switch transistor T5 may be double gate transistors. Both the fourth switch transistor T4 and the fifth switch transistor T5 are double gate transistors as an example. Referring to FIG. 6, the fourth switch transistor T4 may be the first double gate transistor. The first double gate transistor may transmit the second clock signal inputted from the second clock signal terminal CK2 to the third node N3 under the control of the effective pulse signal inputted from the signal input terminal PREV. The fifth switch transistor T5 may be the second double gate transistor. The second double gate transistor may transmit the second clock signal inputted from the second clock signal terminal CK2 to the third node N3 under the control of the second clock signal inputted from the second clock signal terminal CK2.

The specific structure of the third sub-control unit 210 in the above embodiment is used as an example. In certain embodiments, the third sub-control unit 210 is not limited to the structure provided in the above embodiment and may have other structures.

To realize the functions of the fourth sub-control unit 220, in the disclosed light-emitting control signal generation circuit, referring to FIGS. 5-6, the fourth sub-control unit 220 may include a sixth switch transistor T6, a seventh switch transistor T7, and a third capacitor C3.

A gate of the sixth switch transistor T6 may be electrically connected to the third node N3. A source thereof may be electrically connected to the first clock signal terminal CK1. A drain thereof may be electrically connected to the fourth node N4.

A gate of the seventh switch transistor T7 may be electrically connected to the signal input terminal PREV. A source thereof may be electrically connected to the second voltage signal terminal VGH. A drain thereof may be electrically connected to the fourth node N4. The third capacitor C3 may be connected between the third node N3 and the fourth node N4.

In one embodiment, the sixth switch transistor T6 may transmit the first clock signal inputted from the first clock signal terminal CK1 to the fourth node N4 under the control of the potential-level on the third node N3. The seventh switch transistor T7 may transmit the second voltage signal inputted from the second voltage signal terminal VGH to the fourth node N4 under the control of the effective pulse signal inputted from the signal input terminal PREV. The third capacitor C3 may maintain a voltage difference between the third node N3 and the fourth node N4.

In one embodiment, both the sixth switch transistor T6 and the seventh switch transistor T7 may be P-type transistors, the potential-level on the third node N3 may be at a low level, and the effective pulse signal inputted from the signal input terminal PREV may be a low-potential-level signal. In another embodiment, both the sixth switch transistor T6 and the seventh switch transistor T7 may be N-type transistors, the potential-level on the third node N3 may be at a high level, and the effective pulse signal inputted from the signal input terminal PREV may be a high-potential-level signal.

The specific structure of the fourth sub-control unit 220 in the above embodiment is used as an example. In certain embodiments, the fourth sub-control unit 220 is not limited to the structure provided in the above embodiment and may have other structures.

To realize the functions of the fifth sub-control unit 230, in the disclosed light-emitting control signal generation circuit, referring to FIGS. 5-6, the fifth sub-control unit 230 may include an eighth switch transistor T8.

A gate of the eighth switch transistor T8 may be electrically connected to the fourth node N4. A source thereof may be electrically connected to the first voltage signal terminal VGL. A drain thereof may be electrically connected to the second node N2. In one embodiment, the eighth switch transistor T8 may transmit the first voltage signal inputted from the first voltage signal terminal VGL to the second node N2 under the control of the potential-level on the fourth node N4.

In one embodiment, the eighth switch transistor T8 may be a P-type transistor, and the potential-level on the fourth node N4 may be at a low level. In another embodiment, the eighth switch transistor T8 may be an N-type transistor, and the potential-level on the fourth node N4 may be at a high level.

The specific structure of the fifth sub-control unit 230 in the above embodiment is used as an example. In certain embodiments, the fifth sub-control unit 230 is not limited to the structure provided in the above embodiment and may have other structures.

To realize the functions of the sixth sub-control unit 240, in the disclosed light-emitting control signal generation circuit, referring to FIGS. 5-6, the sixth sub-control unit 240 may include a ninth switch transistor T9.

A gate of the ninth switch transistor T9 may be electrically connected to the first node N1. A source thereof may be electrically connected to the second voltage signal terminal VGH. A drain thereof may be electrically connected to the second node N2. In one embodiment, the ninth switch transistor T9 may transmit the second voltage signal inputted from the second voltage signal terminal VGH to the second node N2 under the control of the potential-level on the first node N1.

In one embodiment, the ninth switch transistor T9 may be a P-type transistor, and the potential-level on the first node N1 may be at a low level. In another embodiment, the ninth switch transistor T9 may be an N-type transistor, and the potential-level on the first node N1 may be at a high level.

The specific structure of the sixth sub-control unit 240 in the above embodiment is used as an example. In certain embodiments, the sixth sub-control unit 240 is not limited to the structure provided in the above embodiment and may have other structures.

To realize the functions of the output unit 300, in the disclosed light-emitting control signal generation circuit, referring to FIG. 4, a first terminal of the output unit 300 may be electrically connected to the first node N1. A second terminal thereof may be electrically connected to the second node N2. A third terminal thereof may be electrically connected to the first voltage signal terminal VGL. A fourth terminal thereof may be electrically connected to the second voltage signal terminal VGH. A fifth terminal thereof may be electrically connected to the signal output terminal OUT. In one embodiment, the output unit 300 may transmit the first voltage signal inputted from the first voltage signal terminal VGL to the signal output terminal OUT under the control of the potential-level on the first node N1. In another embodiment, the output unit 300 may transmit the second voltage signal inputted from the second voltage signal terminal VGH to the signal output terminal OUT under the control of the potential-level on the second node N2.

To realize the functions of the output unit 300, in the disclosed light-emitting control signal generation circuit, referring to FIGS. 5-6, the output unit 300 may include a tenth switch transistor T10, an eleventh switch transistor T11, and a fourth capacitor C4.

A gate of the tenth switch transistor T10 may be electrically connected to the second node N2. A source thereof may be electrically connected to the second voltage signal terminal VGH. A drain thereof may be electrically connected to the signal output terminal OUT.

A gate of the eleventh switch transistor T11 may be electrically connected to the first node N1. A source thereof may be electrically connected to the first voltage signal terminal VGL. A drain thereof may be electrically connected to the signal output terminal OUT. The fourth capacitor C4 may be connected between the second node N2 and the second voltage signal terminal VGH.

In one embodiment, the tenth switch transistor T10 may transmit the second voltage signal inputted from the second voltage signal terminal VGH to the signal output terminal OUT under the control of the potential-level on the second node N2. The eleventh switch transistor T11 may transmit the first voltage signal inputted from the first voltage signal terminal VGL to the signal output terminal OUT under the control of the potential-level on the first node N1. The fourth capacitor C4 may maintain the potential-level on the second node N2 under the action of the second voltage signal inputted from the second voltage signal terminal VGH.

In one embodiment, both the tenth switch transistor T10 and the eleventh switch transistor T11 may be P-type transistors, the potential-level on the second node N2 may be at a low level, and the potential-level on the first node N1 may be at a low level. In another embodiment, both the tenth switch transistor T10 and the eleventh switch transistor T11 may be N-type transistors, the potential-level on the second node N2 may be at a high level, and the potential-level on the first node N1 may be at a high level.

The specific structure of the output unit 300 in the above embodiment is used as an example. In certain embodiments, the output unit 300 is not limited to the structure provided in the above embodiment and may have other structures.

In one embodiment, the switch transistors T1, T2, and T4-T11 in the disclosed light-emitting control signal generation circuit may be P-type transistors (referring to FIGS. 5-6). In another embodiment, the switch transistors T1, T2, and T4-T11 thereof may be N-type transistors (not illustrated). Thus, the pixel circuit manufacturing process may be simplified.

In the disclosed light-emitting control signal generation circuit, in one embodiment, each switch transistor may be a low temperature polysilicon thin film transistor (TFT). In another embodiment, each switch transistor may be a metal-oxide-semiconductor field-effect transistor (MOS). In certain embodiments, the switch transistor may have other structures. In one embodiment, the source and drain of each transistor may be interchangeable without specific distinction. In the following embodiments, each transistor is a thin film transistor as an example.

Figure 7:
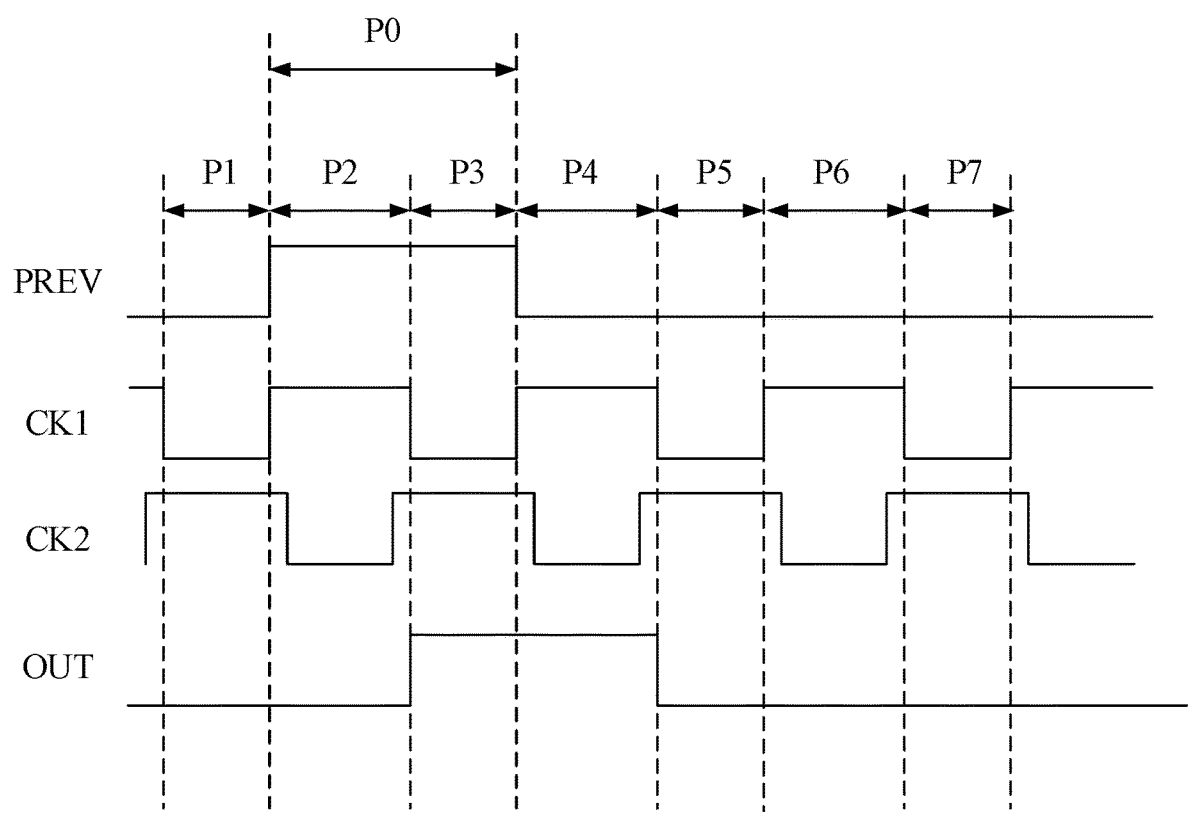
FIG. 7 illustrates an input and output timing sequence diagram consistent with various disclosed embodiments of the present disclosure.

In one embodiment, in conjunction with the light-emitting control signal generation circuit illustrated in FIG. 6 and an input and output timing sequence diagram illustrated in FIG. 7, phases P1-P5 are used as an example to describe the operation process of the disclosed light-emitting control signal generation circuit in detail. Among them, '1' indicates a high-potential-level signal, and '0' indicates a low-potential-level signal. '1' and '0' are logic potential-levels to better explain the specific operation process in various embodiments of the present disclosure, rather than the specific voltage values applied on the gate of each switch transistor.

In phase P1, PREV=0, CK1=0, and CK2=1. Since PREV=0, the fourth switch transistor T4, the seventh switch transistor T7 and the second switch transistor T2 may be turned on. Therefore, the fourth switch transistor T4 may transmit the second clock signal inputted from the second clock signal terminal CK2 to the third node N3, such that the potential-level on the third node N3 may be at a high level. The seventh switch transistor T7 may transmit the second voltage signal inputted from the second voltage signal terminal VGH to the fourth node N4, such that the potential-level on the fourth node N4 may be at a high level. The second switch transistor T2 may transmit the second clock signal inputted from the second clock signal terminal CK2 to the 'a' terminal of the second capacitor C2, such that the potential-level on the 'a' terminal thereof may be at a high level. Since the potential-level on the fourth node N4 is at a high level, the eighth switch transistor T8 may be turned off. In addition, since PREV=0 and CK1=0, the first switch transistor T1 may be turned on and may transmit the effective pulse signal inputted from the signal input terminal PREV to the first node N1, such that the potential-level on the first node N1 may be at a low level. Thus, the ninth switch transistor T9 may be turned on and may transmit the second voltage signal inputted from the second voltage signal terminal VGH to the second node N2. Therefore, the potential-level on the second node N2 may be pulled up, such that the tenth switch transistor T10 may be turned off. At the same time, since the potential-level on the first node N1 is at a low level, the eleventh switch transistor T11 may be turned on, and may transmit the first voltage signal inputted from the first voltage signal terminal VGL to the signal output terminal OUT, such that the signal output terminal OUT may output a low-potential-level signal.

In phase P2, PREV=1, CK1=1, and CK2=0. Since CK2=0, the fifth switch transistor T5 may be turned on to pull down the potential-level on the third node N3 to a low level. Thus, the sixth switch transistor T6 may be turned on and may transmit the first clock signal inputted from the first clock signal terminal CK1 to the fourth node N4, such that the potential-level on the fourth node N4 may be kept at a high level. Since PREV=1, the fourth switch transistor T4, the seventh switch transistor T7, and the second switch transistor T2 may be turned off. Since PREV=1 and CK1=1, the first switch transistor T1 may be turned off. Therefore, the potential-level on the first node N1 may be kept at a low level under the action of the second capacitor C2. The eleventh switch transistor T11 may continue to transmit the first voltage signal inputted from the first voltage signal terminal VGL to the signal output terminal OUT, such that the signal output terminal OUT may output a low-potential-level signal.

In phase P3, PREV=1, CK1=0, and CK2=1. Since PREV=1 and CK1=0, the first switch transistor T1 may be turned on, and may transmit the effective pulse signal inputted from the signal input terminal PREV to the first node N1, such that the potential-level on the first node N1 may be pulled up to a high level to charge the first capacitor C1. Since the second capacitor C2 may maintain the voltage difference between the 'a' terminal and the 'b' terminal of the second capacitor C2 (i.e., the first node N1), when the potential-level on the first node N1 is at a high level, the potential-level on the 'a' terminal may be pulled down to a low level. Since the potential-level on the first node N1 is at a high level, the eleventh switch transistor T11 may be turned off, and may stop outputting a low-potential-level signal to the signal output terminal OUT. Since the potential-level on the third node N3 is at a low level in the phase P2, the sixth switch transistor T6 may continue to transmit the first clock signal inputted from the first clock signal terminal CK1 to the fourth node N4. Since CK1=0, the potential-level on the fourth node N4 may be at a low level. Since the third capacitor C3 may maintain the voltage difference between the third node N3 and the fourth node N4, when the potential-level on the fourth node N4 is at a low level, the sixth switch transistor T6 may be turned on until the potential-level on the third node N3 is pulled up. However, when the potential-level on the fourth node N4 is at a low level, the eighth switch transistor T8 may be turned on to pull down the potential-level on the second node N2 to a low level, such that the tenth switch transistor T10 may be turned on and may transmit the second voltage signal inputted from the second voltage signal terminal VGH to the signal output terminal OUT. Thus, the signal output terminal OUT may output a high-potential-level signal.

In phase P4, PREV=0, CK1=1, and CK2=0. Although PREV=0, under the action of the first clock signal inputted from the first clock signal terminal CK1 and the second voltage signal inputted from the second voltage signal terminal VGH, the potential-level on the fourth node N4 may be at a high level and the eighth switch transistor T8 may be turned off. However, under the action of the fourth capacitor C4, the potential-level on the second node N2 may continue to be kept at a low level, such that the signal output terminal OUT may continue to output a high-potential-level signal under the action of the tenth switch transistor T10. Since PREV=0 and CK2=0, the potential-level on the 'a' terminal of the second capacitor C2 may continue to be kept at a low level. The potential-level on the first node N1 may continue to be kept at a high level under the action of the second capacitor C2. Therefore, the eleventh switch transistor T11 may be still turned off to avoid interfering with the high-potential-level signal outputted from the signal output terminal OUT.

In phase P5, PREV=0, CK1=0, and CK2=1. Since PREV=0 and CK1=0, the first switch transistor T1 may be turned on and may transmit the effective pulse signal inputted from the signal input terminal PREV to the first node N1, such that the potential-level on the first node N1 may be pulled down to a low level. Thus, the ninth switch transistor T9 may be turned on, and may transmit the second voltage signal inputted from the second voltage signal terminal VGH to the second node N2 to pull up the potential-level on the second node N2, such that the tenth switch transistor T10 may be turned off. At the same time, since the potential-level on the first node N1 is at a low level, the eleventh switch transistor T11 may be turned on, and may transmit the first voltage signal inputted from the first voltage signal terminal VGL to the signal output terminal OUT, such that the signal output terminal OUT may output a low-potential-level signal.

Figure 8:
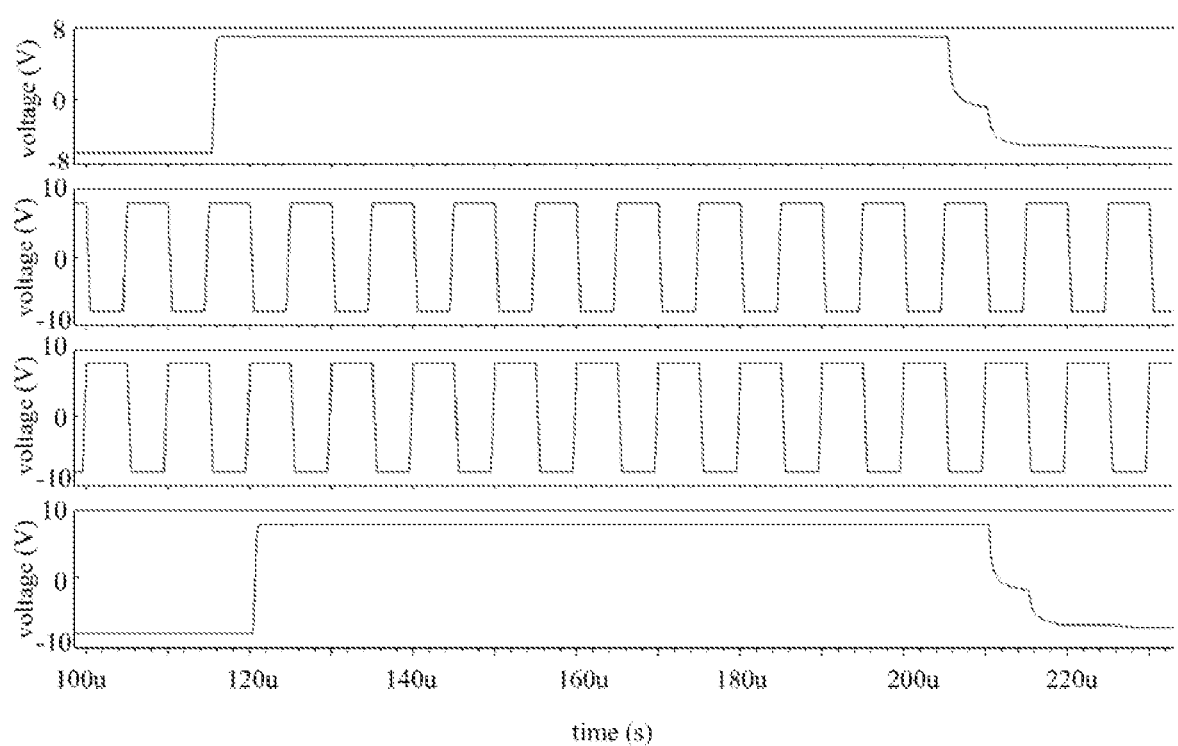
FIG. 8 illustrates a simulation result corresponding to the structure illustrated in FIG. 6 consistent with various disclosed embodiments of the present disclosure.

The pulse width of the effective pulse signal inputted from the signal input terminal PREV may determine the pulse width of the signal outputted from the signal output terminal OUT by setting the light-emitting control signal generation circuit. The above result may be verified through the simulation result illustrated in FIG. 8. Therefore, in the disclosed light-emitting control signal generation circuit, the pulse width of the effective pulse signal inputted from the signal input terminal PREV may be set according to the different brightness display requirement, to adjust the pulse width of the light-emitting control signal outputted from the light-emitting control signal generation circuit. The screen display quality may increase while increasing the flexibility of the screen display, and the power consumption of the system may be reduced.

Figure 9:
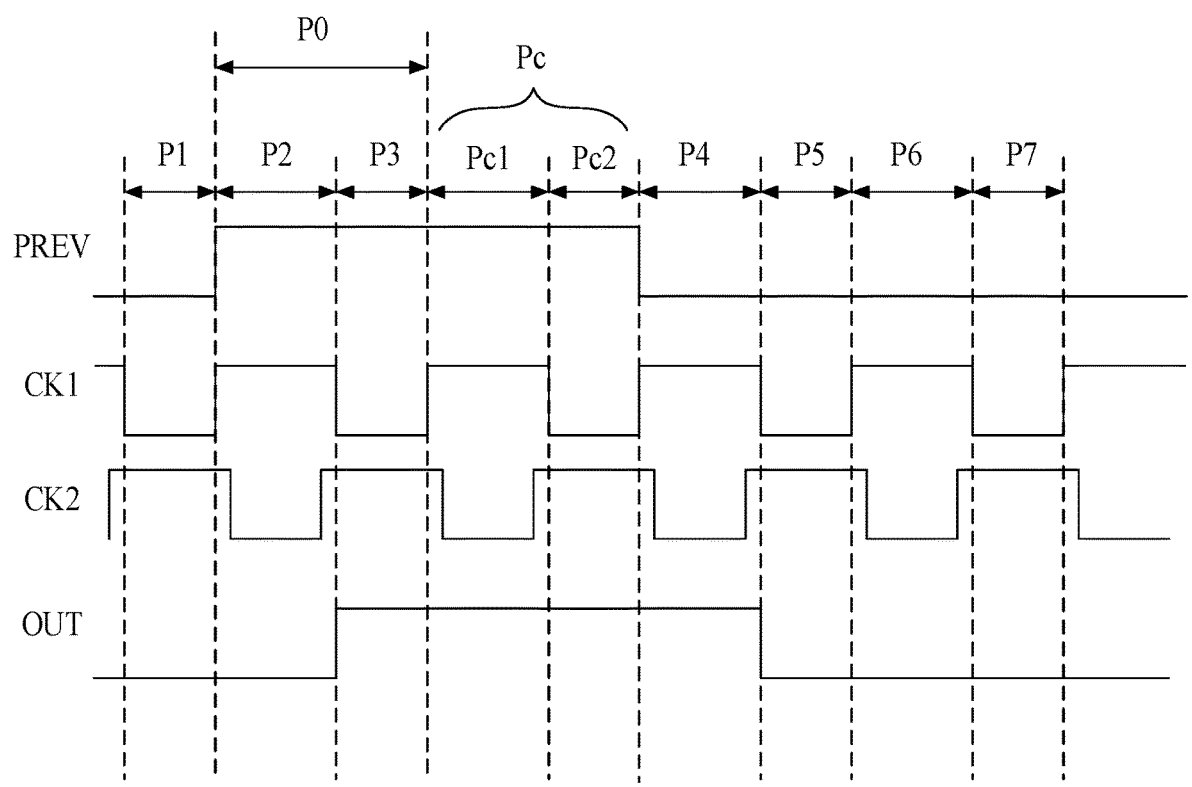
FIG. 9 illustrates another input and output timing sequence diagram consistent with various disclosed embodiments of the present disclosure.

In another embodiment, in conjunction with the light-emitting control signal generation circuit illustrated in FIG. 6 and an input and output timing sequence diagram illustrated in FIG. 9, a maintenance phase Pc is inserted between the phases P3 and P4 as an example to describe the operation process of the disclosed light-emitting control signal generation circuit in detail. The maintenance phase Pc may include a first sub-phase Pc1 and a second sub-phase Pc2. Among them, '1' indicates a high-potential-level signal and '0' indicates a low-potential-level signal. '1' and '0' are logic potential-levels to better explain the specific operation process in various embodiments of the present disclosure, rather than the specific voltage values applied on the gate of each switch transistor.

In phase P1, PREV=0, CK1=0, and CK2=1. Since PREV=0, the fourth switch transistor T4, the seventh switch transistor T7 and the second switch transistor T2 may be turned on. Therefore, the fourth switch transistor T4 may transmit the second clock signal inputted from the second clock signal terminal CK2 to the third node N3, such that the potential-level on the third node N3 may be at a high level. The seventh switch transistor T7 may transmit the second voltage signal inputted from the second voltage signal terminal VGH to the fourth node N4, such that the potential-level on the fourth node N4 may be at a high level. The second switch transistor T2 may transmit the second clock signal inputted from the second clock signal terminal CK2 to the 'a' terminal of the second capacitor C2, such that the potential-level on the 'a' terminal thereof may be at a high level. Since the potential-level on the fourth node N4 is at a high level, the eighth switch transistor T8 may be turned off. In addition, since PREV=0 and CK1=0, the first switch transistor T1 may be turned on and may transmit the effective pulse signal inputted from the signal input terminal PREV to the first node N1, such that the potential-level on the first node N1 may be at a low level. Thus, the ninth switch transistor T9 may be turned on and may transmit the second voltage signal inputted from the second voltage signal terminal VGH to the second node N2. Therefore, the potential-level on the second node N2 may be pulled up, such that the tenth switch transistor T10 may be turned off. At the same time, since the potential-level on the first node N1 is at a low level, the eleventh switch transistor T11 may be turned on, and may transmit the first voltage signal inputted from the first voltage signal terminal VGL to the signal output terminal OUT, such that the signal output terminal OUT may output a low-potential-level signal.

In phase P2, PREV=1, CK1=1, and CK2=0. Since CK2=0, the fifth switch transistor T5 may be turned on to pull down the potential-level on the third node N3 to a low level. Thus, the sixth switch transistor T6 may be turned on and may transmit the first clock signal inputted from the first clock signal terminal CK1 to the fourth node N4, such that the potential-level on the fourth node N4 may continue to be kept at a high level. Since PREV=1, the fourth switch transistor T4, the seventh switch transistor T7 and the second switch transistor T2 may be turned off. Since PREV=1 and CK1=1, the first switch transistor T1 may be turned off. Therefore, the potential-level on the first node N1 may be kept at a low level under the action of the second capacitor C2. The eleventh switch transistor T11 may continue to transmit the first voltage signal inputted from the first voltage signal terminal VGL to the signal output terminal OUT, such that the signal output terminal OUT may output a low-potential-level signal.

In phase P3, PREV=1, CK1=0, and CK2=1. Since PREV=1 and CK1=0, the first switch transistor T1 may be turned on, and may transmit the effective pulse signal inputted from the signal input terminal PREV to the first node N1, such that the potential-level on the first node N1 may be pulled up to a high level to charge the first capacitor C1. Since the second capacitor C2 may maintain the voltage difference between the 'a' terminal and the 'b' terminal (i.e., the first node N1) of the second capacitor C2, when the potential-level on the first node N1 is at a high level, the potential-level on the 'a' terminal may be pulled down to a low level. Since the potential-level on the first node N1 is at a high level, the eleventh switch transistor T11 may be turned off, and may stop outputting the low-potential-level signal to the signal output terminal OUT. Since the potential-level on the third node N3 is at a low level in the phase P2, the sixth switch transistor T6 may continue to transmit the first clock signal inputted from the first clock signal terminal CK1 to the fourth node N4. Since CK1=0, the potential-level on the fourth node N4 may be at a low level. Since the third capacitor C3 may maintain the voltage difference between the third node N3 and the fourth node N4, when the potential-level on the fourth node N4 is at a low level, the sixth switch transistor T6 may be turned on until the potential-level on the third node N3 is pulled up. However, when the potential-level on the fourth node N4 is at a low level, the eighth switch transistor T8 may be turned on to pull down the potential-level on the second node N2 to a low level, such that the tenth switch transistor T10 may be turned on and may transmit the second voltage signal inputted from the second voltage signal terminal VGH to the signal output terminal OUT. Thus, the signal output terminal OUT may output a high-potential-level signal.

In phase Pc1, PREV=1, CK1=1, and CK2=0. Since CK2=0, the potential-level on the third node N3 may be pulled down to a low level under the action of the fifth switch transistor T5, such that the sixth switch transistor T6 may be turned on, and may transmit the first clock signal inputted from the first clock signal terminal CK1 to the fourth node N4. Since CK1=1, the potential-level on the fourth node N4 may be at a high level, such that the eighth switch transistor T8 may be turned off. Since the potential-level on the second node N2 is at a low level during the phase P3, the potential-level on the second node N2 may continue to be kept at a low level in the phase Pc1 under the bootstrap effect of the fourth capacitor C4. Thus, the tenth switch transistor T10 may be turned on, such that the signal output terminal OUT may continue to output a high-potential-level signal.

In phase Pc2, PREV=1, CK1=0, and CK2=1. Since PREV=1 and CK1=0, the potential-level on the first node N1 may continue to be kept at a high level, such that the eleventh switch transistor T11 may still be turned off. Since the potential-level on the third node N3 is at a low level during the phase Pc1, the sixth switch transistor T6 may continue to transmit the first clock signal inputted from the first clock signal terminal CK1 to the fourth node N4. Since CK1=0, the potential-level on the fourth node N4 may be at a low level. Since the third capacitor C3 may maintain the voltage difference between the third node N3 and the fourth node N4, when the potential-level on the fourth node N4 is at a low level, the sixth switch transistor T6 may be turned on until the potential-level on the third node N3 is pulled up. However, when the potential-level on the fourth node N4 is at a low level, the eighth switch transistor T8 may be turned on to pull down the potential-level on the second node N2 to a low level. Thus, the tenth switch transistor T10 may be turned on, and may transmit the second voltage signal inputted from the second voltage signal terminal VGH to the signal output terminal OUT, such that the signal output terminal OUT may output a high-potential-level signal.

In phase P4, PREV=0, CK1=1, and CK2=0. Although PREV=0, under the action of the first clock signal inputted from the first clock signal terminal CK1 and the second voltage signal inputted from the second voltage signal terminal VGH, the potential-level on the fourth node N4 may be at a high level, such that the eighth switch transistor T8 may be turned off. However, under the action of the fourth capacitor C4, the potential-level on the second node N2 may continue to be kept at a low level, such that the signal output terminal OUT may continue to output a high-potential-level signal under the action of the tenth switch transistor T10. Since PREV=0 and CK2=0, the potential-level on the 'a' terminal of the second capacitor C2 may continue to be kept at a low level. The potential-level on the first node N1 may continue to be kept at a high level under the action of the second capacitor C2. Therefore, the eleventh switch transistor T11 may be still turned off to avoid interfering with the high-potential-level signal outputted from the signal output terminal OUT.

In phase P5, PREV=0, CK1=0, and CK2=1. Since PREV=0 and CK1=0, the first switch transistor T1 may be turned on and may transmit the effective pulse signal inputted from the signal input terminal PREV to the first node N1, such that the potential-level on the first node N1 may be pulled down to a low level. Thus, the ninth switch transistor T9 may be turned on, and may transmit the second voltage signal inputted from the second voltage signal terminal VGH to the second node N2 to pull up the potential-level on the second node N2, such that the tenth switch transistor T10 may be turned off. At the same time, since the potential-level on the first node N1 is at a low level, the eleventh switch transistor T11 may be turned on, and may transmit the first voltage signal inputted from the first voltage signal terminal VGL to the signal output terminal OUT, such that the signal output terminal OUT may output a low-potential-level signal.

When the inputted effective pulse signal is prolonged, in other words, when the pulse width of the inputted effective pulse signal increases, the pulse width of the outputted effective pulse signal increases. Thus, the pulse width of the outputted effective pulse signal may be controlled to adapt different brightness display requirements.

Figure 10:
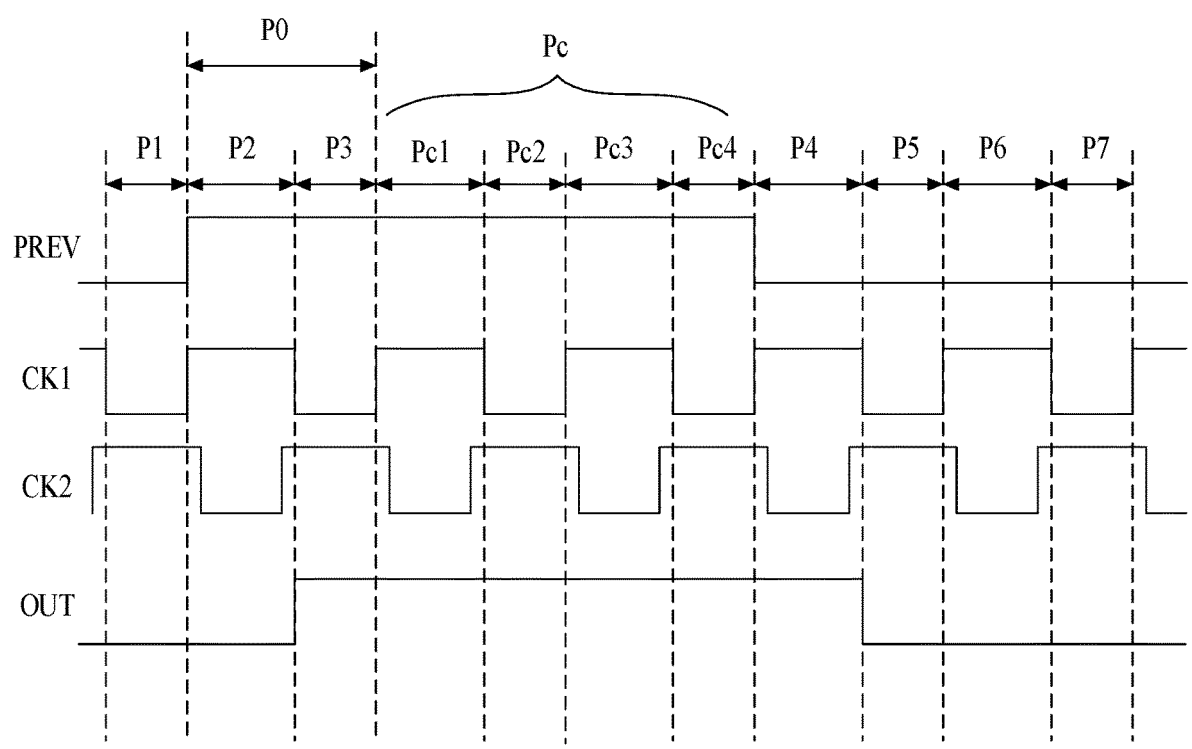
FIG. 10 illustrates another input and output timing sequence diagram consistent with various disclosed embodiments of the present disclosure.

In another embodiment, in conjunction with light-emitting control signal generation circuit illustrated in FIG. 6, two maintenance phases may be added between the phases P3 and P4, as an input and output timing sequence diagram illustrated in FIG. 10. In the phases P1, P2, P3, P4 and P5, the operation processes of each switch transistor and each capacitor are consistent with that in the above embodiments. The operation processes in the maintenance phases Pc1 and Pc3 are consistent with that in the maintenance phase Pc1 in the above embodiment, and the operation processes in the maintenance phases Pc2 and Pc4 are consistent with that in the maintenance phase Pc2 in the above embodiment. Therefore, the operation processes in the maintenance phases Pc1-Pc4 may be referred to the descriptions associated with Pc1 and Pc2 in the above embodiments, and are not repeated herein.

Figure 11:
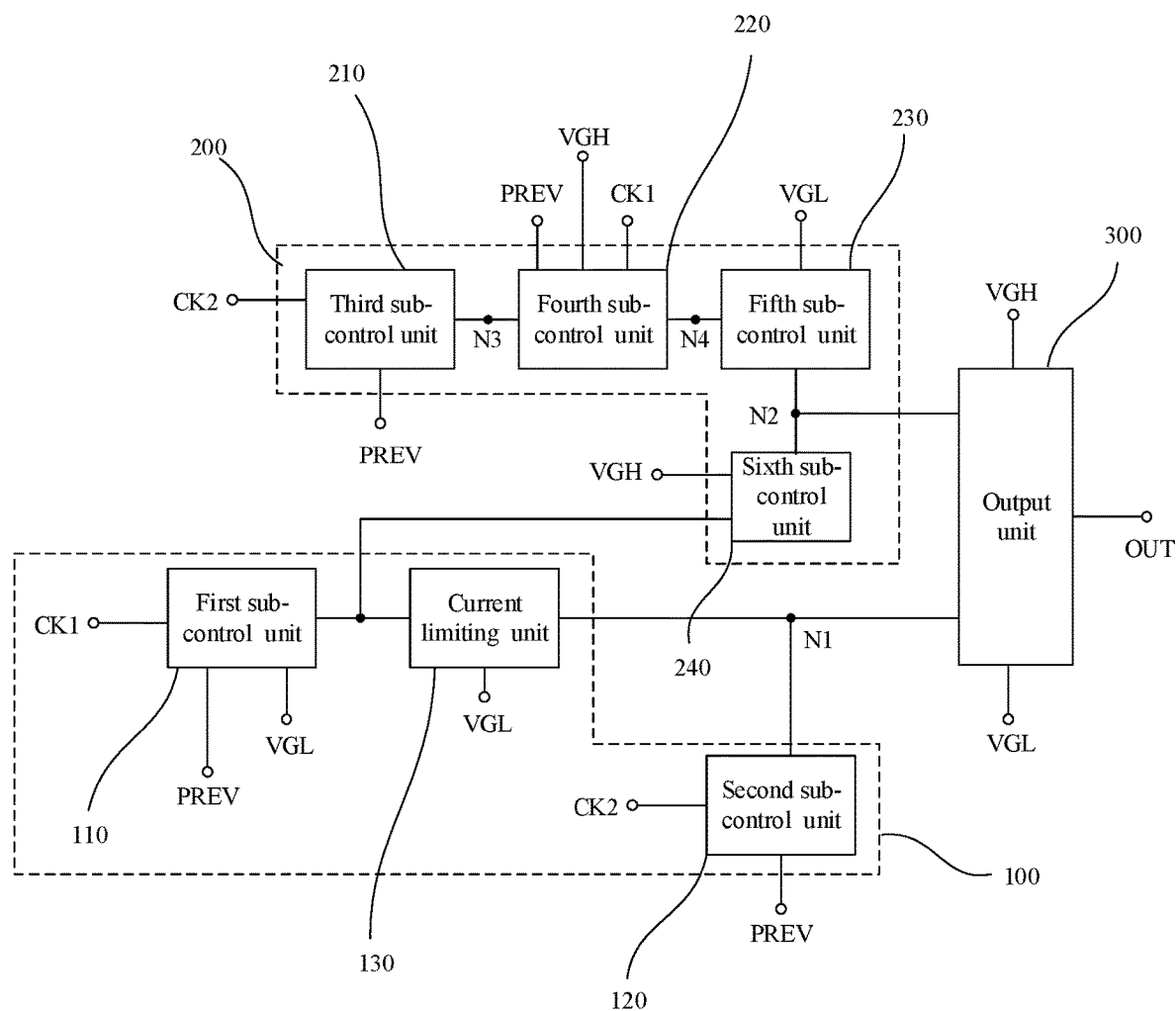
FIG. 11 illustrates a schematic diagram of another light-emitting control signal generation circuit consistent with various disclosed embodiments of the present disclosure.

The present disclosure also provides another light-emitting control signal generation circuit. According to the structure of the light-emitting control signal generation circuit in the above embodiment, not only the second switch transistor T2, but also the fifth switch transistor T5 and the third capacitor C3 may control the potential-level on the first node N1. Thus, when the signal output terminal OUT needs to output a low-potential-level signal, the potential-level on the first node N1 may be controlled to be at a low level. When the signal output terminal OUT needs to output a high-potential-level signal, the potential-level on the first node N1 may be controlled to be at a high level. Therefore, it is essential to control the potential-level on the first node N1. On the other hand, the potential-level on the first node N1 may also affect the operating states of the first switch transistor T1, the ninth switch transistor T9 and the eleventh switch transistor T11. When the potential-level on the first node N1 is too low under the control of the fifth switch transistor T3 and the third capacitor C3, the operating states of the first switch transistor T1, the ninth switch transistor T9 and the eleventh switch transistor T11 may be affected and may even be damaged to affect the normal operation of the light-emitting control signal generation circuit. Therefore, to maintain stability of the potential-level on the first node N1 and to prevent the first switch transistor T1, the ninth switch transistor T9 and the eleventh switch transistor T11 from being damaged, in the disclosed light-emitting control signal generation circuit, referring to FIG. 11, the first control unit 100 may include a current limiting unit 130 besides the first sub-control unit 110 and the second sub-control unit 120.

A first terminal of the current limiting unit 130 may be electrically connected to the first node N1. A second terminal thereof may be electrically connected to the third terminal of the first sub-control unit 110. A third terminal thereof may be electrically connected to the first voltage signal terminal VGL.

The current limiting unit 130 may conduct the third terminal of the first sub-control unit 110 and the first node N1 under the control of the first voltage signal inputted from the first voltage signal terminal VGL.

In one embodiment, when setting the current limiting unit 130, the current limiting unit 130 may be disposed between the first sub-control unit 110 and the second sub-control unit 120, and the first terminal of the sixth sub-control unit 240 may be disposed on one side of the current limiting unit 130 close to the first sub-control unit 110, to facilitate protecting the sixth sub-control unit 240 from being adversely affected.

Figure 12:
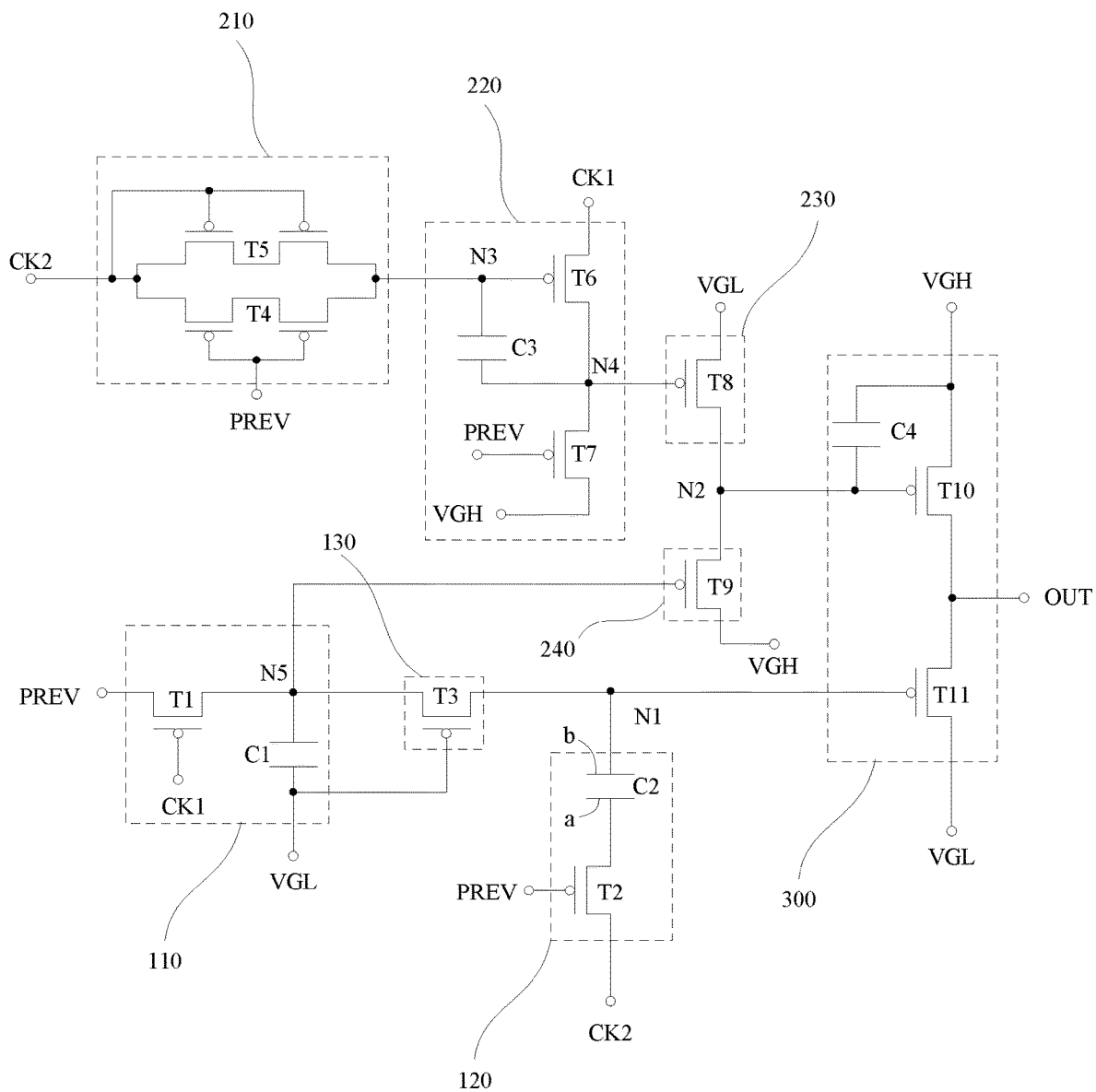
FIG. 12 illustrates a schematic diagram of another light-emitting control signal generation circuit consistent with various disclosed embodiments of the present disclosure.

In one embodiment, to realize the functions of the current limiting unit 130, in the disclosed light-emitting control signal generation circuit, referring to FIG. 12, the current limiting unit 130 may include a third switch transistor T3.

A gate of the third switch transistor T3 may be electrically connected to the first voltage signal terminal VGL. A source of the third switch transistor T3 may be electrically connected to the third terminal of the first sub-control unit 110, and a drain of the third switch transistor T3 may be electrically connected to the first node N1.

To clearly illustrate the functions of the current limiting unit 130 and other units, the third terminal of the first sub-control unit 110 may be renamed as a fifth node N5. Therefore, the source of the third switch transistor T3 may be electrically connected to the fifth nodes N5. The gate of the ninth switch transistor T9 may be electrically connected to the fifth node N5. The drain of the first switch transistor T1 may be electrically connected to the fifth node N5. One terminal of the first capacitor may be electrically connected to the fifth node N5.

In one embodiment, the third switch transistor T3 may conduct the fifth node N5 and the first node N1 under the control of the first voltage signal inputted from the first voltage signal terminal VGL.

In one embodiment, the third switch transistor T3 may be a P-type transistor. The first voltage signal inputted from the first voltage signal terminal VGL may be a low-potential-level signal. In another embodiment, when the third switch transistor is an N-type transistor, the first voltage signal inputted from the first voltage signal terminal may be a high-potential-level signal.

The specific structure of the current limiting unit 130 in the above embodiment is used as an example. In certain embodiments, the current limiting unit 130 is not limited to the structure provided in the above embodiment and may have other structures.

In one embodiment, the switch transistors T1-T11 in the disclosed light-emitting control signal generation circuit may be P-type transistors (referring to FIG. 12). In another embodiment, the switch transistors T1-T11 may be N-type transistors (not illustrated). In this way, the pixel circuit manufacturing process may be simplified.

In the disclosed light-emitting control signal generation circuit, in one embodiment, each switch transistor may be a low temperature polysilicon thin film transistor (TFT). In another embodiment, each switch transistor may be a metal-oxide-semiconductor field-effect transistor (MOS). In certain embodiments, the switch transistor may have other structures. In one embodiment, the source and drain of each transistors may be interchangeable without specific distinction. In the described embodiments, each transistor is a thin film transistor as an example.

In another embodiment, in conjunction with the light-emitting control signal generation circuit illustrated in FIG. 12 and an input and output timing sequence diagram illustrated in FIG. 7, phases P1-P7 are used as an example to describe the operation process of the disclosed light-emitting control signal generation circuit in detail. Among them, '1' indicates a high-potential-level signal and '0' indicates a low-potential-level signal. '1' and '0' are logic potential-levels to better explain the specific operation process in various embodiments of the present disclosure, rather than the specific voltage values applied on the gate of each switch transistor.

In phase P1, PREV=0, CK1=0, and CK2=1. Since PREV=0, the fourth switch transistor T4, the seventh switch transistor T7 and the second switch transistor T2 may be turned on. Therefore, the fourth switch transistor T4 may transmit the second clock signal inputted from the second clock signal terminal CK2 to the third node N3, such that the potential-level on the third node N3 may be at a high level. The seventh switch transistor T7 may transmit the second voltage signal inputted from the second voltage signal terminal VGH to the fourth node N4, such that the potential-level on the fourth node N4 may be at a high level. The second switch transistor T2 may transmit the second clock signal inputted from the second clock signal terminal CK2 to the 'a' terminal of the second capacitor C2, such that the potential-level on the 'a' terminal thereof may be at a high level. Since the potential-level on the fourth node N4 is at a high level, the eighth switch transistor T8 may be turned off. In addition, since PREV=0 and CK1=0, the first switch transistor T1 may be turned on and may transmit the effective pulse signal inputted from the signal input terminal PREV to the fifth node N5, such that the potential-level on the fifth node N5 may be at a low level. Thus, the ninth switch transistor T9 may be turned on and may transmit the second voltage signal inputted from the second voltage signal terminal VGH to the second node N2. Therefore, the potential-level on the second node N2 may be pulled up, such that the tenth switch transistor T10 may be turned off. Since the gate of the third switch transistor T3 is electrically connected to the first voltage signal terminal VGL, the third switch transistor T3 may continue to be turned on, such that the potential-level on the fifth node N5 may be the same as the potential-level on the first node N1 and may be kept at a low level. Thus, the eleventh switch transistor T11 may be turned on, and may transmit the first voltage signal inputted from the first voltage signal terminal VGL to the signal output terminal OUT, such that the signal output terminal OUT may output a low-potential-level signal.

In phase P2, PREV=1, CK1=1, and CK2=0. Since CK2=0, the fifth switch transistor T5 may be turned on to pull down the potential-level on the third node N3 to a low level. Thus, the sixth switch transistor T6 may be turned on and may transmit the first clock signal inputted from the first clock signal terminal CK1 to the fourth node N4, such that the potential-level on the fourth node N4 may continue to be kept at a high level. Since PREV=1, the fourth switch transistor T4, the seventh switch transistor T7 and the second switch transistor T2 may be turned off. Since PREV=1 and CK1=1, the first switch transistor T1 may be turned off, and the potential-level on the fifth node N5 may be stably kept at a low level. Since PREV=1, the second switch transistor T2 may be turned off, such that the potential-level on the first node N1 may not fluctuate, and may be stably kept at a low level. Therefore, the third switch transistor T3 may continue to be turned on, such that the potential-level on the first node N1 may be kept at a low level. The eleventh switch transistor T11 may continue to transmit the first voltage signal inputted from the first voltage signal terminal VGL to the signal output terminal OUT, such that the signal output terminal OUT may output a low-potential-level signal.

In phase P3, PREV=1, CK1=0, and CK2=1. Since PREV=1, the second switch transistor T2 may be always turned off. Since CK1=0, the first switch transistor T1 may be turned on, and the potential-level on the fifth node N5 may be pulled up to a high level. When the third switch transistor T3 is turned on, the potential-level on the first node N1 may be pulled up to a high level. Since the second capacitor C2 may maintain the voltage difference between the first node N1 and the 'a' terminal of the second capacitor C2, the potential-level on the 'a' terminal may be pulled down to a low level. At the same time, since the second switch transistor T2 is always turned off, the potential-level on the 'a' terminal may be stably kept at a low level, and the potential-level on the first node N1 may be stably kept at a high level. Thus, the third switch transistor may not be turned off and may remain to be turned on. Since the potential-level on the first node N1 is at a high level, the eleventh switch transistor T11 may be turned off, and may stop outputting the low-potential-level signal to the signal output terminal OUT.

Since the potential-level on the third node N3 is at a low level in the phase P2, the sixth switch transistor T6 may continue to transmit the first clock signal inputted from the first clock signal terminal CK1 to the fourth node N4. Since CK1=0, the potential-level on the fourth node N4 may be at a low level. Since the third capacitor C3 may maintain the voltage difference between the third node N3 and the fourth node N4, when the potential-level on the fourth node N4 is at a low level, the sixth switch transistor T6 may be turned on until the potential-level on the third node N3 is pulled up. However, when the potential-level on the fourth node N4 is at a low level, the eighth switch transistor T8 may be turned on to pull down the potential-level on the second node N2 to a low level, such that the tenth switch transistor T10 may be turned on and may transmit the second voltage signal inputted from the second voltage signal terminal VGH to the signal output terminal OUT. Thus, the signal output terminal OUT may output a high-potential-level signal.

In phase P4, PREV=0, CK1=1, and CK2=0. Since PREV=0 and CK2=0, even when the second switch transistor T2 is turned on, the potential-level on the 'a' terminal is still at a high level, since CK1=1, the first switch transistor T1 may be turned off. Thus, the potential-level on the first node N1 may be stabilized at a high level, such that the third switch transistor T3 may still remain to be turned on.

Although PREV=0, under the action of the first clock signal inputted from the first clock signal terminal CK1 and the second voltage signal inputted from the second voltage signal terminal VGH, the potential-level on the fourth node N4 may be at a high level and the eighth switch transistor T8 may be turned off. However, under the action of the fourth capacitor C4, the potential-level on the second node N2 may still be kept at a low level, such that the signal output terminal OUT may continue to output a high-potential-level signal under the action of the tenth switch transistor T10. Since the potential-level on the first node N1 may be kept at a high level, the eleventh switch transistor T11 may still remain to be turned off to avoid interfering with the high-potential-level signal outputted from the signal output terminal OUT.

In phase P5, PREV=0, CK1=0, and CK2=1. Since PREV=0 and CK2=1, when the second switch transistor T2 is turned on, the potential-level on the 'a' terminal may be pulled up to a high level. Since CK1=0, when the first switch transistor T1 is turned on, the potential-level on the fifth node N5 may be pulled down to a low level. Thus, when the third switch transistor T3 is turned on, the potential-level on the first node N1 may be pulled down to a low level. At the same time, the potential-level on the first node N1 may be stably kept at a low level under the action of the second capacitor C2, such that the third switch transistor T3 may remain to be turned on in the phase P5.

In addition, since the potential-level on the first node N1 is at a low level, the ninth switch transistor T9 may be turned on, and may transmit the second voltage signal inputted from the second voltage signal terminal VGH to the second node N2 to pull up the potential-level on the second node N2, such that the tenth switch transistor T10 may be turned off. At the same time, since the potential-level on the first node N1 is at a low level, the eleventh switch transistor T11 may be turned on, and may transmit the first voltage signal inputted from the first voltage signal terminal VGL to the signal output terminal OUT, such that the signal output terminal OUT may output a low-potential-level signal.

In phase P6, PREV=0, CK1=1, and CK2=0. Since PREV=0 and CK2=0, the fourth switch transistor T4 and the seventh switch transistor T7 may be turned on, such that the potential-level on the third node N3 may be at a low level and the potential-level on the fourth node N4 may be at a high level. Thus, the eighth switch transistor T8 may still remain to be turned off, such that the potential-level on the second node N2 may be kept at a high level, and the tenth switch transistor may be turned off. Since PREV=0 and CK2=0, the second switch transistor T2 may be turned on, such that the potential-level on the 'a' terminal may be pulled down to a low level. At the same time, since CK1=1, the first switch transistor T1 may be turned off. Therefore, under the action of the second capacitor C2, to maintain the voltage difference across the second capacitor C2, the potential-level on the first node N1 may be further pulled down until the potential-level on the first node N1 is lower than the potential-level on the first voltage signal, such that the third switch transistor T3 may be turned off. The other transistors may be prevented from being affected while ensuring that the signal output terminal OUT outputs a low-potential-level signal.

In phase P7, PREV=0, CK1=0, and CK2=1. Since PREV=0 and CK2=1, when the second switch transistor T2 is turned on, the potential-level on the 'a' terminal may be pulled up to pull the potential-level on the first node N1 back to a normal low level under the action of the second capacitor C2. At the same time, since CK1=0, when the first switch transistor T1 is turned on, the potential-level on the fifth node N5 may be at a normal low level, such that the third switch transistor T3 may be turned on to ensure the normal operation of each switch transistor.

In the operation process in the above embodiments, when the signal output terminal OUT outputs a low potential-level signal after outputting a high potential-level signal, under the action of the second switch transistor T2 and the second capacitor C2, the potential-level on the first node N1 may be further pulled down to be lower than the potential-level on the first voltage signal (i.e., the potential-level on the gate of the third switch transistor T3). Therefore, the third switch transistor T3 may be turned off to protect the first switch transistor T1 and the ninth switch transistor T9 from being damaged, and to ensure the normal operation of the light-emitting control signal generation circuit, facilitating the normal display of the display panel.

In another embodiment, in conjunction with light-emitting control signal generation circuit illustrated in FIG. 12 and an input and output timing sequence diagram illustrated in FIG. 9, a maintenance phase Pc is inserted between the phases P3 and P4 as an example to describe the operation process of the disclosed light-emitting control signal generation circuit in detail. The maintenance phase Pc may include a first sub-phase Pc1 and a second sub-phase Pc2. Among them, '1' indicates a high-potential-level signal and '0' indicates a low-potential-level signal. '1' and '0' are logic potential-levels to better explain the specific operation process in various embodiments of the present disclosure, rather than the specific voltage values applied on the gate of each switch transistor.

In phase P1, PREV=0, CK1=0, and CK2=1. Since the operation process of each switch transistor in the present phase is consistent with that of each switch transistor in the phase P1 in the above embodiment, the operation process of each switch transistor in the present phase may be referred to the descriptions associated with phase P1 in the above embodiment, and is not repeated herein.

In phase P2, PREV=1, CK1=1, and CK2=0. Since the operation process of each switch transistor in the present phase is consistent with that of each switch transistor in the phase P2 in the above embodiment, the operation process of each switch transistor in the present phase may be referred to the descriptions associated with phase P2 in the above embodiment, and is not repeated herein.

In phase P3, PREV=1, CK1=0, and CK2=1. Since the operation process of each switch transistor in the present phase is consistent with that of each switch transistor in the phase P3 in the above embodiment, the operation process of each switch transistor in the present phase may be referred to the descriptions associated with phase P3 in the above embodiment, and is not repeated herein.

In phase Pc1, PREV=1, CK1=1, and CK2=0. Since PREV=1 and CK2=0, the second switch transistor T2 may be still turned off. Since CK1=1, the first switch transistor T1 may be turned off. Therefore, the potential-levels on the fifth node N5, the first node N1 and the 'a' terminal in the present phase may be consistent with that in the phase P3. In other words, the potential-levels on the fifth node N5 and the first node N1 may be at a high level, and the potential-level on the 'a' terminal may be at a low level, such that the third switch transistor T3 may remain to be turned on.

Since CK2=0, the potential-level on the third node N3 may be pulled down to a low level under the action of the fifth switch transistor T5, such that the sixth switch transistor T6 may be turned on, and may transmit the first clock signal inputted from the first clock signal terminal CK1 to the fourth node N4. Since CK1=1, the potential-level on the fourth node N4 may be at a high level, such that the eighth switch transistor T8 may be turned off. Since the potential-level on the second node N2 is at a low level during the phase P3, the potential-level on the second node N2 may be kept at a low level in the phase Pc1 under the bootstrap effect of the fourth capacitor C4. Thus, the tenth switch transistor T10 may be turned on, such that the signal output terminal OUT may continue to output a high-potential-level signal.

In phase Pc2, PREV=1, CK1=0, and CK2=1. Since PREV=1 and CK2=1, the second switch transistor T2 may be still turned off. Since CK1=0, the first switch transistor T1 may be turned on, such that the potential-level on the fifth node N5 may be stably kept at a high level. Thus, the potential-level on the first node N1 may be stably kept at a high level, and the potential-level on the 'a' terminal may be stably kept at a low level, the third switch transistor T3 may remain to be turned on.

Since the potential-level on the third node N3 is at a low level during the phase Pc1, the sixth switch transistor T6 may continue to transmit the first clock signal inputted from the first clock signal terminal CK1 to the fourth node N4.

Since CK1=0, the potential-level on the fourth node N4 may be at a low level. Since the third capacitor C3 may maintain the voltage difference between the third node N3 and the fourth node N4, when the potential-level on the fourth node N4 is at a low level, the sixth switch transistor T6 may be turned on until the potential-level on the third node N3 is pulled up. However, when the potential-level on the fourth node N4 is at a low level, the eighth switch transistor T8 may be turned on to pull down the potential-level on the second node N2 to a low level. Thus, the tenth switch transistor T10 may be turned on, and may transmit the second voltage signal inputted from the second voltage signal terminal VGH to the signal output terminal OUT, such that the signal output terminal OUT may output a high-potential-level signal.

In phase P4, PREV=0, CK1=1, and CK2=0. Since the operation process of each switch transistor in the present phase is consistent with that of each switch transistor in the phase P4 in the above embodiment, the operation process of each switch transistor in the present phase may be referred to the descriptions associated with phase P4 in the above embodiment, and is not repeated herein.

In phase P5, PREV=0, CK1=0, and CK2=1. Since the operation process of each switch transistor in the present phase is consistent with that of each switch transistor in the phase P5 in the above embodiment, the operation process of each switch transistor in the present phase may be referred to the descriptions associated with phase P5 in the above embodiment, and is not repeated herein.

In phase P6, PREV=0, CK1=1, and CK2=0. Since the operation process of each switch transistor in the present phase is consistent with that of each switch transistor in the phase P6 in the above embodiment, the operation process of each switch transistor in the present phase may be referred to the descriptions associated with phase P6 in the above embodiment, and is not repeated herein.

In phase P7, PREV=0, CK1=0, and CK2=1. Since the operation process of each switch transistor in the present phase is consistent with that of each switch transistor in the phase P7 in the above embodiment, the operation process of each switch transistor in the present phase may be referred to the descriptions associated with phase P7 in the above embodiment, and is not repeated herein.

In another embodiment, in conjunction with the light-emitting control signal generation circuit illustrated in FIG. 12 and the input and output timing sequence diagram illustrated in FIG. 10, the operation processes of each switch transistor and each capacitor in the phases P1, P2, P3, P4, P5, P6 and P7, are consistent with that in the above embodiment. The operation processes in the maintenance phases Pc1 and Pc3 are consistent with that in the maintenance phase Pc1 in the above embodiment, and the operation processes in the maintenance phases Pc2 and Pc4 are consistent with that in the maintenance phase Pc2 in the above embodiment. Therefore, the operation processes in the maintenance phases Pc1-Pc4 may be referred to the descriptions associated with Pc1 and Pc2 in the above embodiment, and are not repeated herein.

In the light-emitting control signal generation circuit illustrated in FIG. 12, when at least one maintenance phase is inserted between the phases P3 and P4, the pulse width of the outputted effective pulse signal may still be the same as the pulse width of the inputted effective pulse signal. The pulse width of the outputted effective pulse signal may be adjusted by adjusting the pulse width of the inputted effective pulse signal to adapt different brightness display requirements, facilitating reducing the system power consumption.

In one embodiment, in one of the light-emitting control signal generation circuits consistent with various disclosed embodiments, and in the input and output timing sequence diagram illustrated in FIGS. 7, 9 and 10, the duration of the high-potential-level signal may be greater than the duration of the low-potential-level signal for both the first clock signal and the second clock signal. In this case, to ensure the normal operation of the light-emitting control signal generation circuit, the first clock signal and the second clock signal may not be set as synchronization signals and may need to have a certain phase difference. How much the rising edge of the second clock signal is earlier than the falling edge of the first clock signal may need to be determined according to specific situations. However, the timing sequences of the first clock signal and the second clock signal are not limited to FIGS. 7, 9 and 10, and the duration of the high-potential-level signal may be equal to the duration of the low-potential-level signal. In this case, the phase difference between the first clock signal and the second clock signal may be 90 degrees or less, but cannot be 0 degree. In other words, the first clock signal and the second clock signal may not be synchronized to ensure the normal operation of the light-emitting control signal generation circuit.

Each switch transistor illustrated in FIGS. 5, 6 and 12 may be a P-type transistor, and the timing sequence diagram illustrated in FIGS. 7, 9 and 10 may correspond to the structures illustrated in FIGS. 5, 6 and 12. When each switch transistor is an N-type transistor, the height of each signal in the corresponding timing sequence diagram may be opposite to the height of each signal illustrated in FIGS. 7, 9 and 10, the first voltage signal terminal may be the on voltage, VGH, and the second voltage signal terminal may be the off voltage, VGL. The height of each signal may need to ensure that the light-emitting control signal generation circuit operates normally and outputs the effective pulse signal stably, and is not limited in the present disclosure. In addition, the light-emitting control signal generation circuit may be connected one-to-one correspondingly to light-emitting control signal lines in the electroluminescent display panel. The light-emitting control signal line may input light-emitting control signal for the corresponding each pixel control circuit to control the corresponding light-emitting unit to emit light. Therefore, according to the specific structure and operation principle of the pixel control circuit, the structure of the light-emitting control signal generation circuit (i.e., each switch transistor is an N-type transistor or a P-type transistor) may be set accordingly. Therefore, an effective pulse signal may be inputted to the pixel control circuit through the light-emitting control signal line to ensure the normal display of the electroluminescent display panel.

Figure 13:
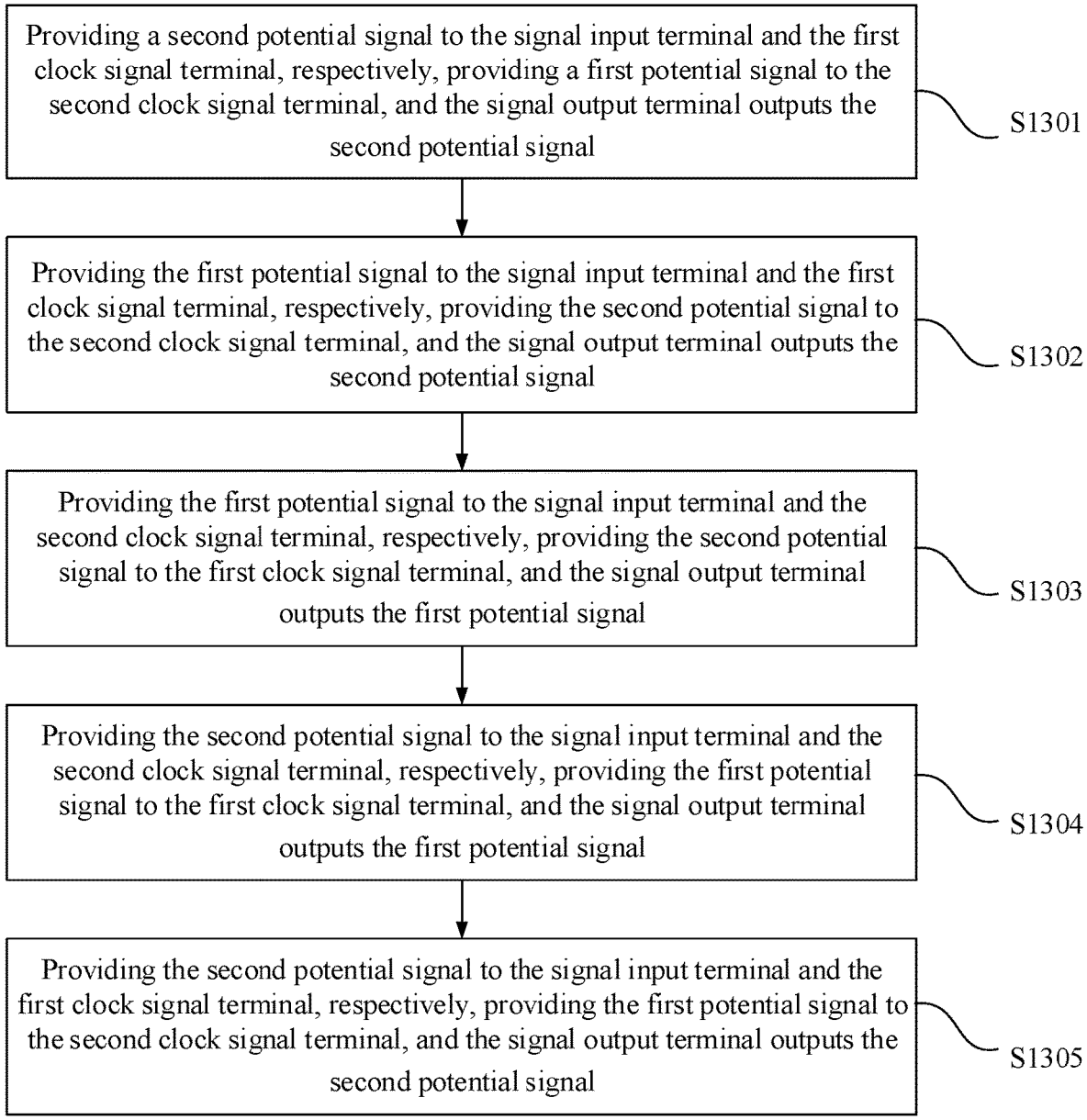
FIG. 13 illustrates a flow chart of an exemplary driving method consistent with various disclosed embodiments of the present disclosure.

The present disclosure also provides a driving method for driving the light-emitting control signal generation circuit. Referring to FIG. 13, the light-emitting control signal generation circuit may include a first phase, a second phase, a third phase, a fourth phase, and a fifth phase, and the driving method may include the following.

S1301: In the first phase, providing a second potential-level signal to the signal input terminal and the first clock signal terminal, respectively, providing a first potential-level signal to the second clock signal terminal, and the signal output terminal may output the second potential-level signal.

S1302: In the second phase, providing the first potential-level signal to the signal input terminal and the first clock signal terminal, respectively, providing the second potential-level signal to the second clock signal terminal, and the signal output terminal may output the second potential-level signal.

S1303: In the third phase, providing the first potential-level signal to the signal input terminal and the second clock signal terminal, respectively, providing the second potential-level signal to the first clock signal terminal, and the signal output terminal may output the first potential-level signal.

S1304: In the fourth phase, providing the second potential-level signal to the signal input terminal and the second clock signal terminal, respectively, providing the first potential-level signal to the first clock signal terminal, and the signal output terminal may output the first potential-level signal.

S1305: In the fifth phase, providing the second potential-level signal to the signal input terminal and the first clock signal terminal, respectively, providing the first potential-level signal to the second clock signal terminal, and the signal output terminal may output the second potential-level signal.

In one embodiment, in the light-emitting control signal generation circuit, there may also include at least one maintenance phase between the third phase and the fourth phase. The maintenance phase may include a first sub-phase and a second sub-phase. The driving method may also include the following.

In the first sub-phase, providing the first potential-level signal to the signal input terminal and the first clock signal terminal, respectively, providing the second potential-level signal to the second clock signal terminal, and the signal output terminal may output the first potential-level signal.

In the second sub-phase, providing the first potential-level signal to the signal input terminal and the second clock signal terminal, respectively, providing the second potential-level signal to the first clock signal terminal, and the signal output terminal may output the first potential-level signal.

The present disclosure also provides an electroluminescent display panel. The electroluminescent display panel may include a plurality of cascaded light-emitting control signal generation circuits consistent with disclosed embodiments.

Figure 14:
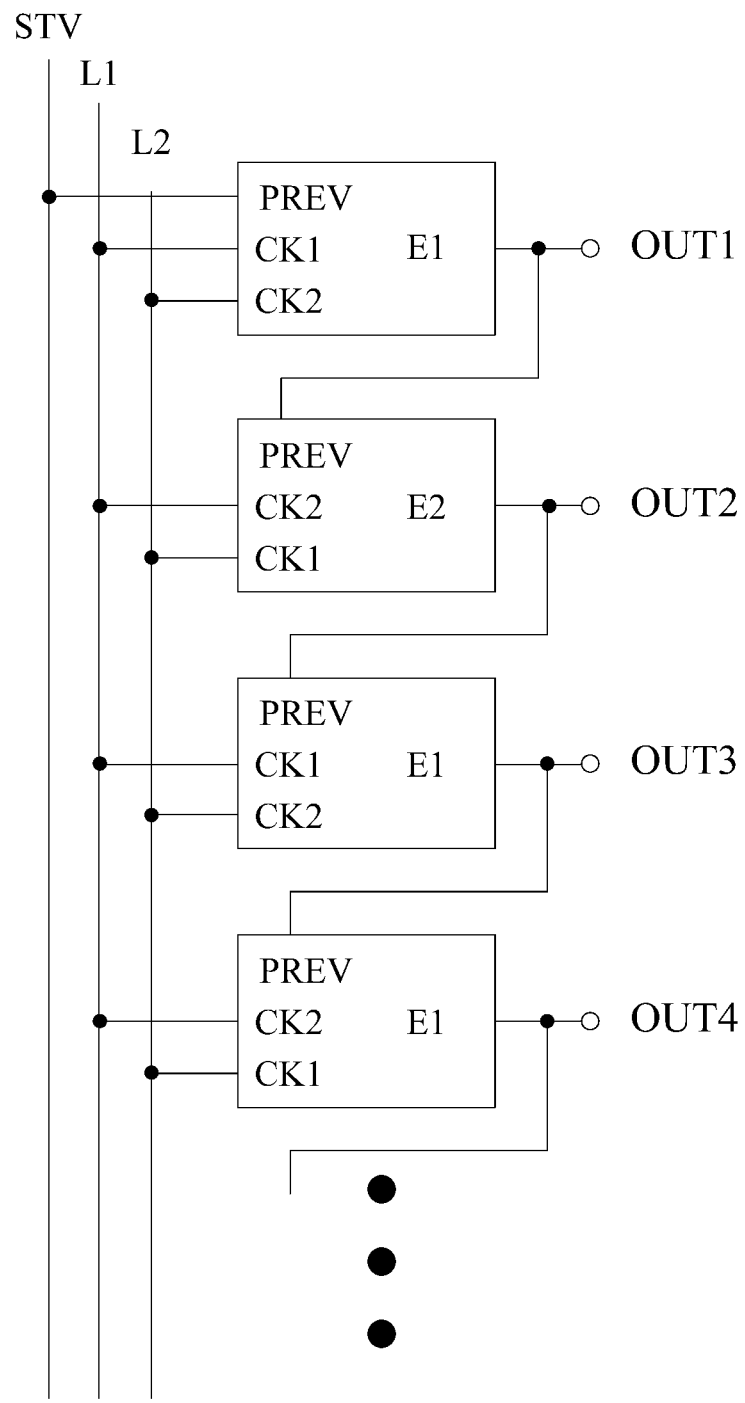
FIG. 14 illustrates a schematic diagram of cascaded light-emitting control signal generation circuits consistent with various disclosed embodiments of the present disclosure.

FIG. 14 illustrates four light-emitting control signal generation circuits, while the electroluminescent display panel may include less than or more than four light-emitting control signal generation circuits. FIG. 14 illustrates a cascaded relationship between the light-emitting control signal generation circuits. In one embodiment, except for the last-stage light-emitting control signal generation circuit, the signal output terminal of each-stage light-emitting control signal generation circuit may output an effective pulse signal into the signal input terminal of the following-stage light-emitting control signal generation circuit.

The signal input terminal of the first-stage light-emitting control signal generation circuit may receive an initial pulse signal. The signal input terminal of the last-stage light-emitting control signal generation circuit may receive the effective pulse signal outputted from the signal output terminal of foregoing-stage light-emitting control signal generation circuit.

In the disclosed electroluminescent display panel, by setting the cascaded relationship between each-stage light-emitting control signal generation circuit, the pulse width of the signal outputted from the first-stage light-emitting control signal generation circuit may determine the pulse width of the signal outputted from another-stage light-emitting control signal generation circuit. The pulse width of the signal outputted from the first-stage light-emitting control signal generation circuit may be determined by the pulse width of the initial pulse signal. Therefore, the adjusted light-emitting control signal may have a stable potential-level. The screen display flexibility may increase while improving the screen display quality, and the system power consumption may be reduced.

In one embodiment, to effectively control each-stage light-emitting control signal generation circuit to output the light-emitting control signal, and to reduce the number of provided wires and the occupied area of the wires to achieve a narrow border design, in the electroluminescent display panel consistent with disclosed embodiments, two clock signal wires may be provided. The two clock signal wires may provide clock signals to the cascaded each light-emitting control signal generating circuit, respectively. In one embodiment, referring to FIG. 14, the first clock signal terminals of the light-emitting control signal generation circuits in odd-stages may be electrically connected to the first clock signal wire, and the second clock signal terminals thereof may be electrically connected to the second clock signal wire. The first clock signal terminals of the light-emitting control signal generation circuits in even-stages may be electrically connected to the second clock signal wire, and the second clock signal terminals thereof may be electrically connected to the first clock signal wire.

In one embodiment, in the four light-emitting control signal generation circuits illustrated in FIG. 14, the first clock signal terminals CK1 of the first-stage light-emitting control signal generation circuit E1 and the third-stage light-emitting control signal generation circuit E3 may be electrically connected to the first clock signal wire L1; and the second clock signal terminals CK2 thereof may be electrically connected to the second clock signal wire L2. The first clock signal terminals CK1 of the second-stage light-emitting control signal generation circuit E2 and the fourth-stage light-emitting control signal generation circuit E4 may be electrically connected to the second clock signal wire L2; and the second clock signal terminals CK2 thereof may be electrically connected to the first clock signal wire L1.

Figure 15:
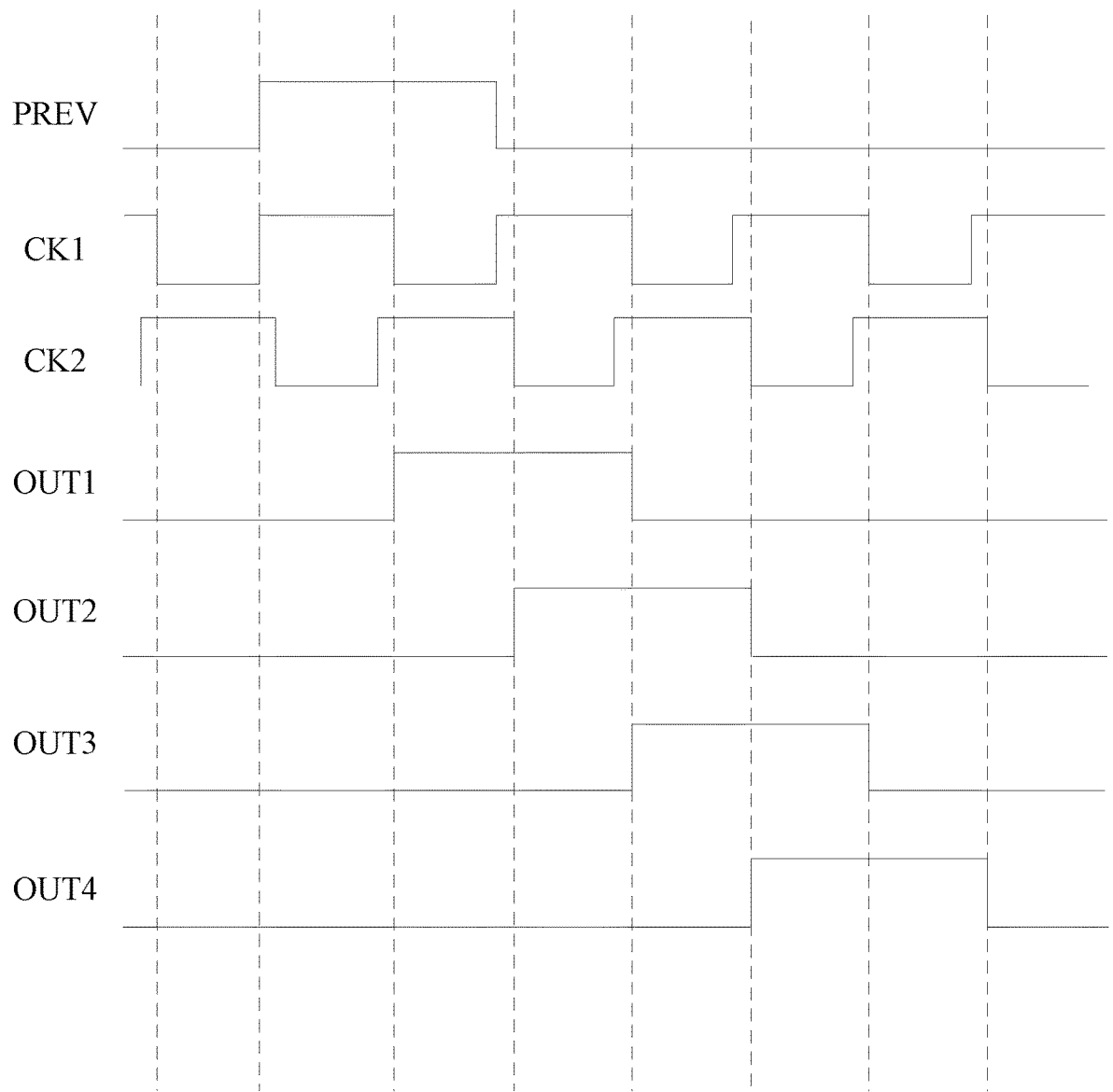
FIG. 15 illustrates an input and output timing sequence diagram corresponding to the structure illustrated in FIG. 14 consistent with various disclosed embodiments of the present disclosure.

FIG. 15 illustrates an input and output timing sequence diagram corresponding to FIG. 14. In the four light-emitting control signal generation circuits illustrated in FIG. 14, the signal output terminal of each-stage light-emitting control signal generation circuit may output the effective pulse signal into the signal input terminal of the following-stage light-emitting control signal generation circuit. In one embodiment, the signal output terminal OUT1 of the first-stage light-emitting control signal generation circuit E1 may output the effective pulse signal into the signal input terminal PREV of the second-stage light-emitting control signal generation circuit E2. The second-stage light-emitting control signal generation circuit E2 may output the light-emitting control signal based on the received pulse signal and the timing sequences of the first clock signal and the second clock signal. Detailed processes may be referred to the light-emitting control signal generation circuit in the above embodiments, and are not repeated herein.

Figure 16:
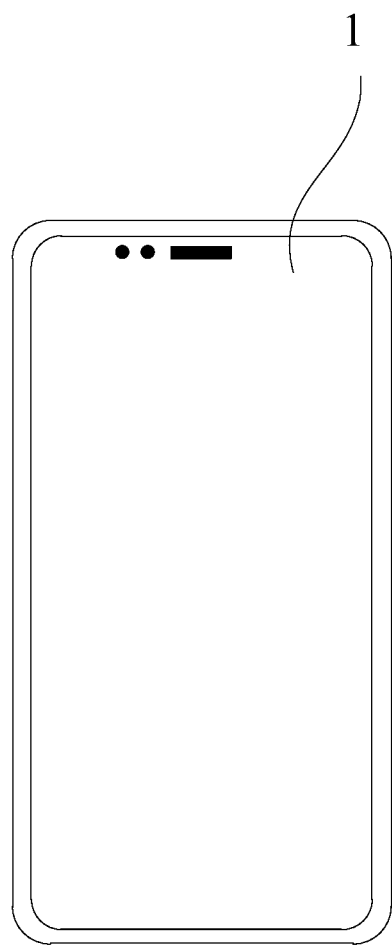
FIG. 16 illustrates a schematic diagram of an exemplary display device consistent with various disclosed embodiments of the present disclosure.

The present disclosure also provides a display device. The display device may include the electroluminescent display panel consistent with disclosed embodiments. The display device may be a mobile phone (illustrated in FIG. 16, where '1' indicates the electroluminescent display panel), tablet, television, monitor, laptop, digital photo frame, navigator and any display products or components having display functions. Other indispensable components of the display device may be understood by those of ordinary skill in the art, and are not described in detail herein. Thus, the present invention is not intended to be limited to the embodiments shown herein.

The present disclosure provides a light-emitting control signal generation circuit and a driving method thereof, an electroluminescent display panel, and a display device, including: the first control unit, the second control unit, and the output unit. The signal output terminal may output a signal having a same pulse width as the effective pulse signal inputted from the signal input terminal through the cooperation of the above three units and simple circuit structure. The pulse width of the outputted signal may be adjusted by adjusting the pulse width of the inputted effective pulse signal to meet different brightness display requirements. By setting the cascaded relationship between each-stage light-emitting control signal generation circuit, the pulse width of the signal outputted from the first-stage light-emitting control signal generation circuit may determine the pulse width of the signal outputted from another-stage light-emitting control signal generation circuit, and the pulse width of the signal outputted from the first-stage light-emitting control signal generation circuit may be determined by the pulse width of the initial pulse signal. Therefore, the adjusted light-emitting control signal may have a stable potential-level. The screen display flexibility may increase while improving the screen display quality, and the system power consumption may be reduced.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and features disclosed herein.

What is claimed is:

1. A light-emitting control signal generation circuit, comprising:
    a first control unit for controlling a potential-level on a first node under control of an effective pulse signal inputted from a signal input terminal, a first clock signal inputted from a first clock signal terminal, a second clock signal inputted from a second clock signal terminal, and a first voltage signal inputted from a first voltage signal terminal;
    a second control unit for controlling a potential-level on a second node under control of the effective pulse signal inputted from the signal input terminal, the first clock signal inputted from the first clock signal terminal, the second clock signal inputted from the second clock signal terminal, the first voltage signal inputted from the first voltage signal terminal, a second voltage signal inputted from a second voltage signal terminal, and the potential-level on the first node; and
    an output unit for transmitting the first voltage signal inputted from the first voltage signal terminal to an signal output terminal under control of the potential-level on the first node, and transmitting the second voltage signal inputted from the second voltage signal terminal to the signal output terminal under control of the potential-level on the second node, respectively.

2. The light-emitting control signal generation circuit according to claim 1, wherein:
    the effective pulse signal inputted from the signal input terminal is a high potential-level signal; and
    both a rising edge and a falling edge of an effective pulse signal outputted from the signal output terminal are aligned with a falling edge of the first clock signal.

3. The light-emitting control signal generation circuit according to claim 2, wherein:
    a pulse width of the effective pulse signal inputted from the signal input terminal is an integral multiple of a periodic pulse width of one of the first clock signal and the second clock signal.

4. The light-emitting control signal generation circuit according to claim 3, wherein:
    the effective pulse signal inputted from the signal input terminal is prolonged for M clock periods, and the effective pulse signal outputted from the signal output terminal is correspondingly prolonged for M clock periods, wherein M is a positive integer.

5. The light-emitting control signal generation circuit according to claim 1, wherein the first control unit includes:
    a first sub-control unit for transmitting the effective pulse signal inputted from the signal input terminal to the first node under control of the first clock signal inputted from the first clock signal terminal and maintaining the potential-level on the first node under control of the first voltage signal inputted from the first voltage signal terminal, wherein a first terminal is electrically connected to the signal input terminal, a second terminal is electrically connected to the first clock signal terminal, a third terminal is electrically connected to the first node, and a fourth terminal is electrically connected to the first voltage signal terminal;
    a second sub-control unit for controlling the potential-level on the first node under control of the effective pulse signal inputted from the signal input terminal and the second clock signal inputted from the second clock signal terminal, wherein a first terminal is electrically connected to the signal input terminal, a second terminal is electrically connected to the second clock signal terminal, and a third terminal is electrically connected to the first node; and
    a current limiting unit for conducting the third terminal of the first sub-control unit and the first node under control of the first voltage signal inputted from the first voltage signal terminal, wherein a first terminal is electrically connected to the first node, a second terminal is electrically connected to the third terminal of the first sub-control unit, and a third terminal is electrically connected to the first voltage signal terminal.

6. The light-emitting control signal generation circuit according to claim 5, wherein the first sub-control unit includes:
    a first switch transistor, wherein a gate is electrically connected to the first clock signal terminal, a source is electrically connected to the signal input terminal, and a drain is electrically connected to the first node; and
    a first capacitor connected between the first node and the first voltage signal terminal.

7. The light-emitting control signal generation circuit according to claim 5, wherein the second sub-control unit includes:
    a second capacitor, wherein a second terminal of the second capacitor is electrically connected to the first node; and
    a second switch transistor, wherein a gate is electrically connected to the signal input terminal, a source is electrically connected to the second clock signal terminal, and a drain is electrically connected to a first terminal of the second capacitor.

8. The light-emitting control signal generation circuit according to claim 5, wherein the current limiting unit includes:
a third switch transistor, wherein a gate is electrically connected to the first voltage signal terminal, a source is electrically connected to the third terminal of the first sub-control unit, and a drain is electrically connected to the first node.

9. The light-emitting control signal generation circuit according to claim 1, wherein the second control unit includes:
a third sub-control unit for transmitting the second clock signal inputted from the second clock signal terminal to a third node under control of the effective pulse signal inputted from the signal input terminal, and transmitting the second clock signal inputted from the second clock signal terminal to the third node under control of the second clock signal inputted from the second clock signal terminal, respectively, wherein a first terminal is electrically connected to the signal input terminal, a second terminal is electrically connected to the second clock signal terminal, and a third terminal is electrically connected to the third node;
a fourth sub-control unit for transmitting the second voltage signal inputted from the second voltage signal terminal to a fourth node under control of the effective pulse signal inputted from the signal input terminal, and transmitting the first clock signal inputted from the first clock signal terminal to the fourth node under control of the potential-level on the third node, respectively, wherein a first terminal is electrically connected to the signal input terminal, a second terminal is electrically connected to the first clock signal terminal, a third terminal is electrically connected to the second voltage signal terminal, a fourth terminal is electrically connected to the third node, and a fifth terminal is electrically connected to a fourth node;
a fifth sub-control unit for transmitting the first voltage signal inputted from the first voltage signal terminal to the second node under control of the potential-level on the fourth node, wherein a first terminal is electrically connected to the fourth node, a second terminal is electrically connected to the first voltage signal terminal, and a third terminal is electrically connected to the second node; and
a sixth sub-control unit for transmitting the second voltage signal inputted from the second voltage signal terminal to the second node under control of the potential-level on the first node, wherein a first terminal is electrically connected to the first node, a second terminal is electrically connected to the second node, and a third terminal is electrically connected to the second voltage signal terminal.

10. The light-emitting control signal generation circuit according to claim 9, wherein the third sub-control unit includes:
a fourth switch transistor, wherein a gate of the fourth switch transistor is electrically connected to the signal input terminal, a source is electrically connected to the second clock signal terminal, and a drain is electrically connected to the third node; and
a fifth switch transistor, wherein a gate and a source are electrically connected to the second clock signal terminal, and a drain is electrically connected to the third node.

11. The light-emitting control signal generation circuit according to claim 10, wherein:

the fourth switch transistor is a first double gate transistor, wherein both a first gate and a second gate are electrically connected to the signal input terminal, a source is electrically connected to the second clock signal terminal, and a drain is electrically connected to the third node; and
the fifth switch transistor is a second double gate transistor, wherein both a first gate and a second gate are electrically connected to the second clock signal terminal, a source is electrically connected to the second clock signal terminal, and a drain is electrically connected to the third node.

12. The light-emitting control signal generation circuit according to claim 9, wherein the fourth sub-control unit includes:
a sixth switch transistor, wherein a gate is electrically connected to the third node, a source is electrically connected to the first clock signal terminal, and a drain is electrically connected to the fourth node;
a seventh switch transistor, wherein a gate is electrically connected to the signal input terminal, a source is electrically connected to the second voltage signal terminal, and a drain is electrically connected to the fourth node; and
a third capacitor connected between the third node and the fourth node.

13. The light-emitting control signal generation circuit according to claim 9, wherein the fifth sub-control unit includes:
an eighth switch transistor, wherein a gate is electrically connected to the fourth node, a source is electrically connected to the first voltage signal terminal, and a drain is electrically connected to the second node.

14. The light-emitting control signal generation circuit according to claim 9, wherein the sixth sub-control unit includes:
a ninth switch transistor, wherein a gate of the ninth switch transistor is electrically connected to the first node, a source is electrically connected to the second voltage signal terminal, and a drain is electrically connected to the second node.

15. The light-emitting control signal generation circuit according to claim 1, wherein:
a first terminal of the output unit is electrically connected to the first node,
a second terminal of the output unit is electrically connected to the second node,
a third terminal of the output unit is electrically connected to the first voltage signal terminal,
a fourth terminal of the output unit is electrically connected to the second voltage signal terminal, and
a fifth terminal of the output unit is electrically connected to the signal output terminal.

16. The light-emitting control signal generation circuit according to claim 15, wherein the output unit includes:
a tenth switch transistor, wherein a gate is electrically connected to the second node, a source is electrically connected to the second voltage signal terminal, and a drain is electrically connected to the signal output terminal;
an eleventh switch transistor, wherein a gate of the eleventh switch transistor is electrically connected to the first node, a source is electrically connected to the first voltage signal terminal, and a drain is electrically connected to the signal output terminal; and
a fourth capacitor connected between the second node and the second voltage signal terminal.

17. An electroluminescent display panel, comprising:
a plurality of cascaded light-emitting control signal generation circuits, wherein the light-emitting control signal generation circuit includes:
a first control unit for controlling a potential-level on a first node under control of an effective pulse signal inputted from a signal input terminal, a first clock signal inputted from a first clock signal terminal, a second clock signal inputted from a second clock signal terminal, and a first voltage signal inputted from a first voltage signal terminal,
a second control unit for controlling a potential-level on a second node under control of the effective pulse signal inputted from the signal input terminal, the first clock signal inputted from the first clock signal terminal, the second clock signal inputted from the second clock signal terminal, the first voltage signal inputted from the first voltage signal terminal, a second voltage signal inputted from a second voltage signal terminal, and the potential-level on the first node, and
an output unit for transmitting the first voltage signal inputted from the first voltage signal terminal to an signal output terminal under control of the potential-level on the first node, and transmitting the second voltage signal inputted from the second voltage signal terminal to the signal output terminal under control of the potential-level on the second node, respectively.

18. The electroluminescent display panel according to claim 17, wherein:
the signal output terminal of each-stage light-emitting control signal generation circuit outputs an effective pulse signal into the signal input terminal of following-stage light-emitting control signal generation circuit except for last-stage light-emitting control signal generation circuit;
the signal input terminal of first-stage light-emitting control signal generation circuit receives an initial pulse signal;
the signal input terminal of the last-stage light-emitting control signal generation circuit receives the effective pulse signal outputted from the signal output terminal of foregoing-stage light-emitting control signal generation circuit;
the first clock signal terminals of the light-emitting control signal generation circuits in odd-stages are electrically connected to a first clock signal wire, and the second clock signal terminals are electrically connected to a second clock signal wire; and
the first clock signal terminals of the light-emitting control signal generation circuits in even-stages are electrically connected to the second clock signal wire, and the second clock signal terminals are electrically connected to the first clock signal wire.

* * * * *